United States Patent
Sugiura et al.

(10) Patent No.: US 9,070,831 B2
(45) Date of Patent: Jun. 30, 2015

(54) LIGHT-EMITTING DEVICE EACH HAVING VARIABLE DISTANCES BETWEEN PAIRS OF ELECTRODE PADS WITH RESPECT TO ZENER DIODES AND LIGHTING APPARATUS USING THE SAME

(71) Applicant: PANASONIC CORPORATION, Osaka (JP)

(72) Inventors: Kenji Sugiura, Osaka (JP); Toshikatsu Kotaki, Osaka (JP); Kenji Ueda, Nara (JP); Yasufumi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/344,130

(22) PCT Filed: Sep. 28, 2012

(86) PCT No.: PCT/JP2012/006227
§ 371 (c)(1),
(2) Date: Mar. 11, 2014

(87) PCT Pub. No.: WO2013/054483
PCT Pub. Date: Apr. 18, 2013

(65) Prior Publication Data
US 2014/0346536 A1   Nov. 27, 2014

(30) Foreign Application Priority Data
Oct. 11, 2011   (JP) ................................ 2011-224382

(51) Int. Cl.
*H01L 33/00*   (2010.01)
*H01L 29/18*   (2006.01)
(Continued)

(52) U.S. Cl.
CPC . *H01L 33/36* (2013.01); *F21S 2/00* (2013.01); *G02F 1/1335* (2013.01);
(Continued)

(58) Field of Classification Search
None
See application file for complete search history.

(56) References Cited

U.S. PATENT DOCUMENTS

2005/0077532 A1   4/2005   Ota et al.
2005/0156186 A1   7/2005   Lin et al.
(Continued)

FOREIGN PATENT DOCUMENTS

CN   101546755   9/2009
CN   101646974   2/2010
(Continued)

OTHER PUBLICATIONS

Search report from International Search Report in PCT/JP2012/006227, mail date is Dec. 25, 2012.
(Continued)

*Primary Examiner* — Michael Jung
(74) *Attorney, Agent, or Firm* — Greenblum & Bernstein, P.L.C.

(57) ABSTRACT

A light-emitting device including: a substrate; LEDs arranged on the substrate in a row; electrode pad pairs each including electrode pads at opposite sides of a corresponding LED in a row direction; Zener diodes (protective elements) in one-to-one correspondence to circuits (groups) U1 to U8 each including nine consecutive LEDs, each protective element being located between adjacent electrode pads; and a sealing member sealing the LEDs, the electrode pad pairs, and the Zener diodes, wherein, in each circuit, a distance between electrode pads included in an electrode pad pair corresponding to an LED located closest to the Zener diode is the shortest, and a distance between electrode pads varies between two electrode pad pairs other than the electrode pad pair corresponding to the closest LED.

10 Claims, 19 Drawing Sheets

(51) Int. Cl.
*H01L 33/36* (2010.01)
*F21S 2/00* (2006.01)
*G02F 1/1335* (2006.01)
*H01L 25/075* (2006.01)
*H01L 27/15* (2006.01)
*H01L 33/50* (2010.01)
*H01L 33/56* (2010.01)
*B60Q 1/26* (2006.01)
*F21V 9/00* (2006.01)
*F21V 1/00* (2006.01)
*F21S 4/00* (2006.01)
*F21V 21/00* (2006.01)
*F21V 29/00* (2006.01)
*H01L 25/16* (2006.01)

(52) U.S. Cl.
CPC .......... *H01L 25/0753* (2013.01); *H01L 25/167* (2013.01); *H01L 2224/48091* (2013.01); *H01L 2224/48137* (2013.01); *H01L 2224/48227* (2013.01); *H01L 27/153* (2013.01); *H01L 33/502* (2013.01); *H01L 33/56* (2013.01)

(56) References Cited

U.S. PATENT DOCUMENTS

| | | |
|---|---|---|
| 2007/0258684 A1 | 11/2007 | Oka et al. |
| 2008/0128739 A1 | 6/2008 | Sanpei et al. |
| 2008/0180959 A1 | 7/2008 | Kishikawa et al. |
| 2010/0133571 A1 | 6/2010 | Kawasaki et al. |
| 2010/0141167 A1 | 6/2010 | Kato |
| 2010/0188852 A1 | 7/2010 | Sanpei et al. |
| 2011/0180817 A1* | 7/2011 | Ishizaki et al. .................. 257/88 |
| 2011/0182073 A1 | 7/2011 | Sanpei et al. |
| 2011/0254022 A1* | 10/2011 | Sasano ............................ 257/88 |
| 2012/0193651 A1* | 8/2012 | Edmond et al. ................. 257/88 |
| 2012/0201028 A1 | 8/2012 | Sanpei et al. |
| 2013/0070452 A1* | 3/2013 | Urano et al. ................... 362/231 |

FOREIGN PATENT DOCUMENTS

| | | |
|---|---|---|
| CN | 201502914 | 6/2010 |
| JP | 59-175174 | 10/1984 |
| JP | 63-044777 | 2/1988 |
| JP | 2003-331604 | 11/2003 |
| JP | 2006-134661 | 5/2006 |
| JP | 2007-035890 | 2/2007 |
| JP | 2008-047851 | 2/2008 |
| JP | 2008-243864 | 10/2008 |
| JP | 2008-244165 | 10/2008 |
| JP | 2009-088343 | 4/2009 |
| JP | 2011-113731 | 6/2011 |
| WO | 2009/011292 | 1/2009 |

OTHER PUBLICATIONS

Japan Office Action, mail date is Mar. 5, 2014.
China Office Action, mail date is Aug. 11, 2014, along with a partial English translation.
Supplementary European Search Report, mail date is Sep. 19, 2014.

* cited by examiner

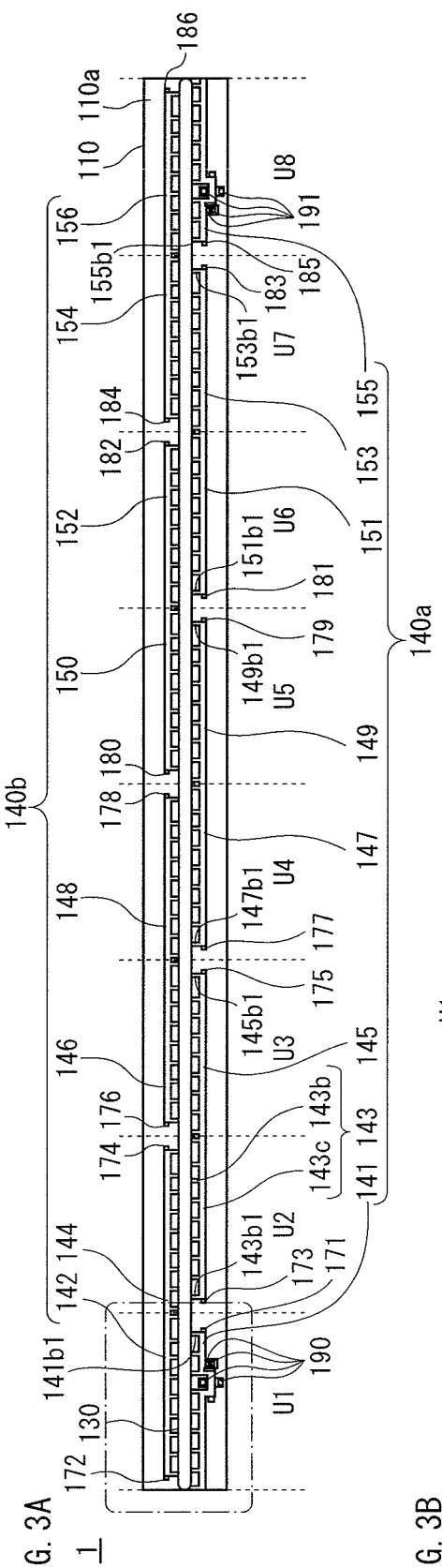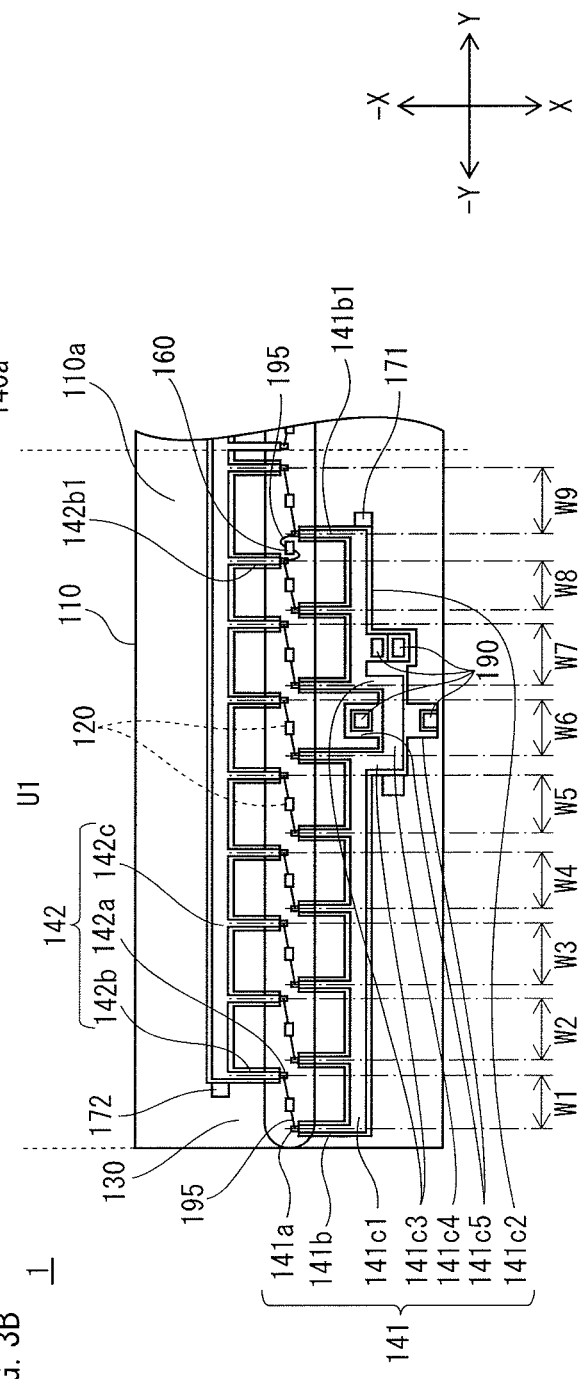

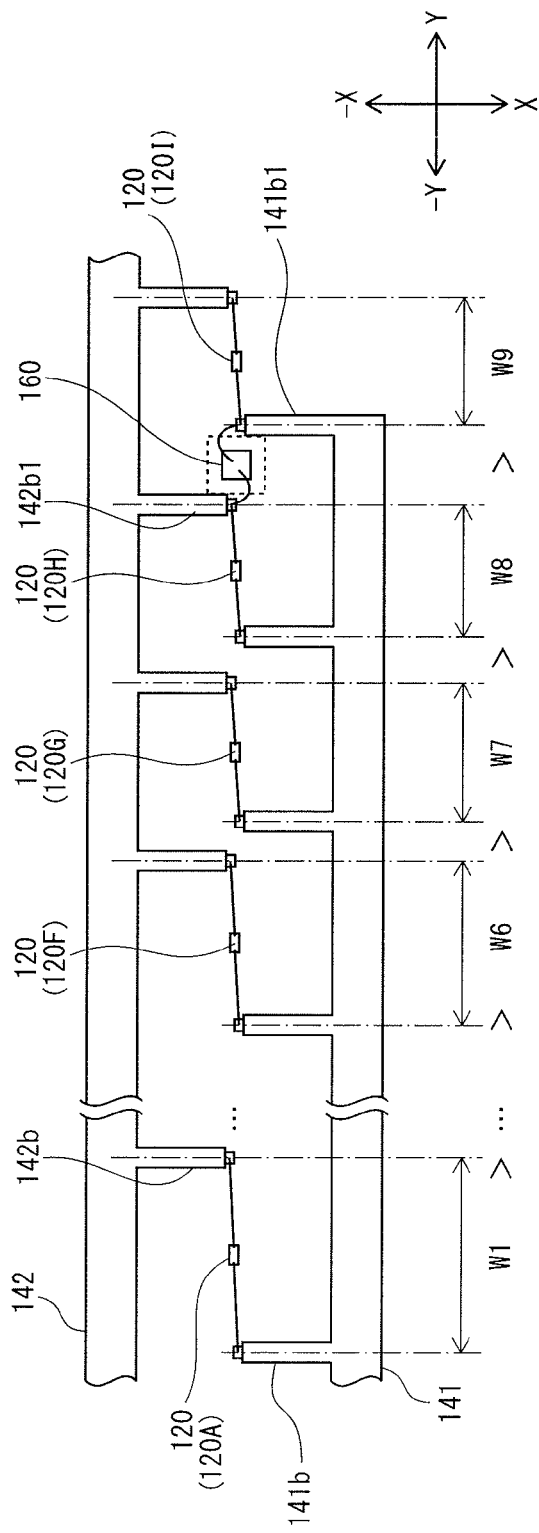
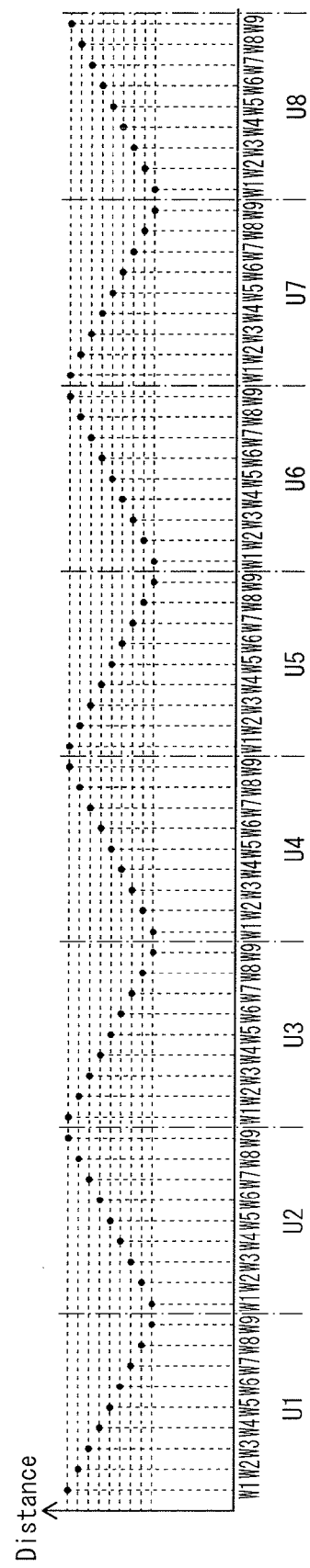
FIG. 5A
FIG. 5B

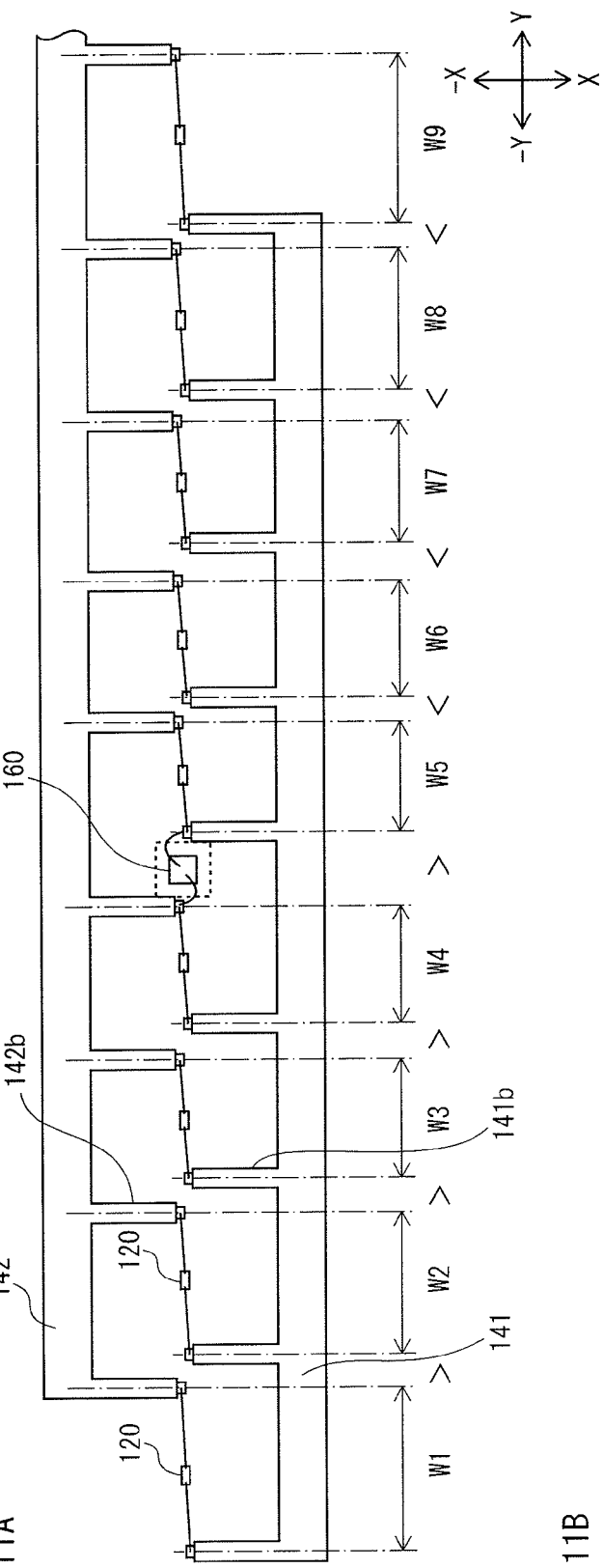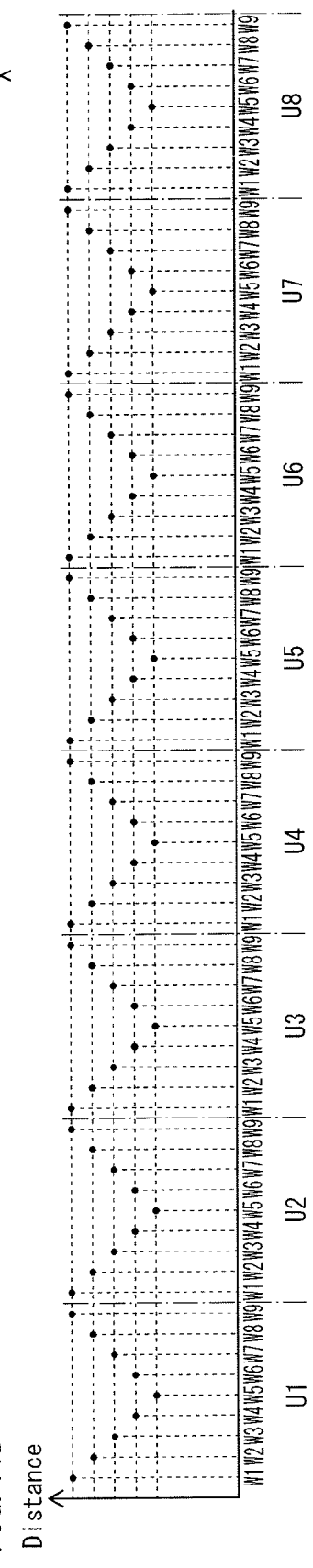

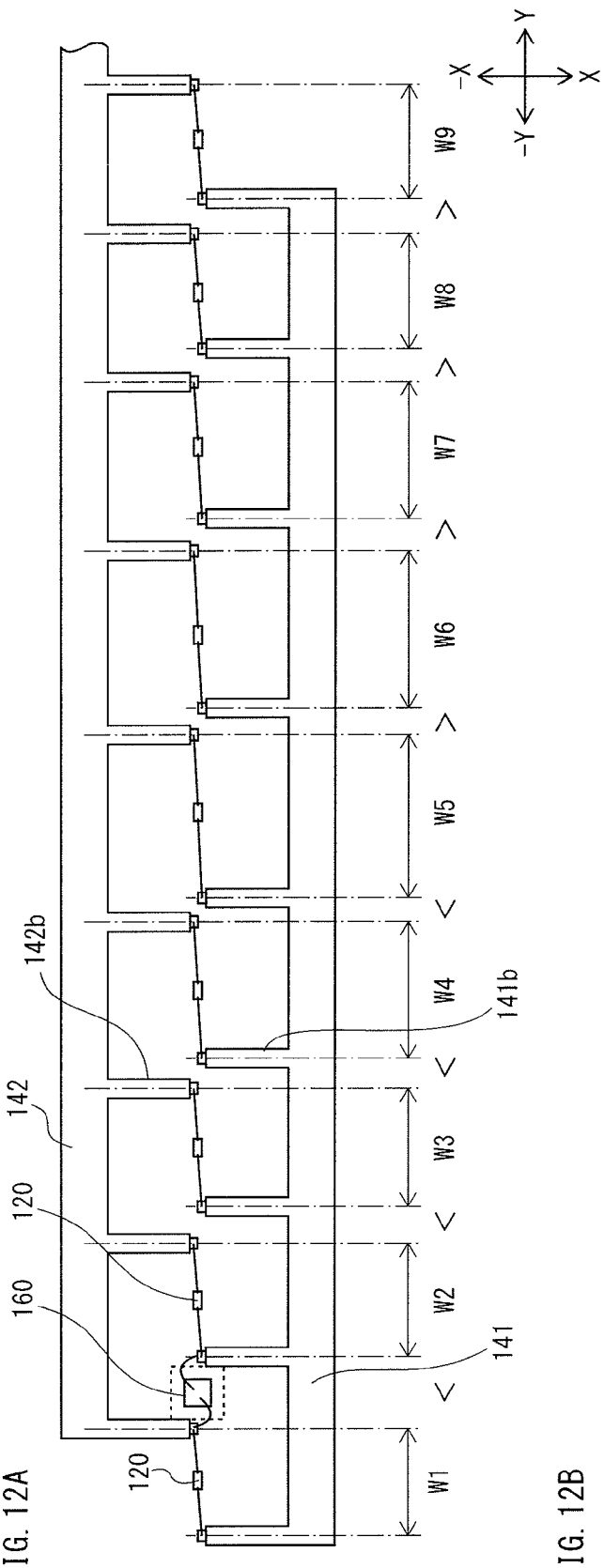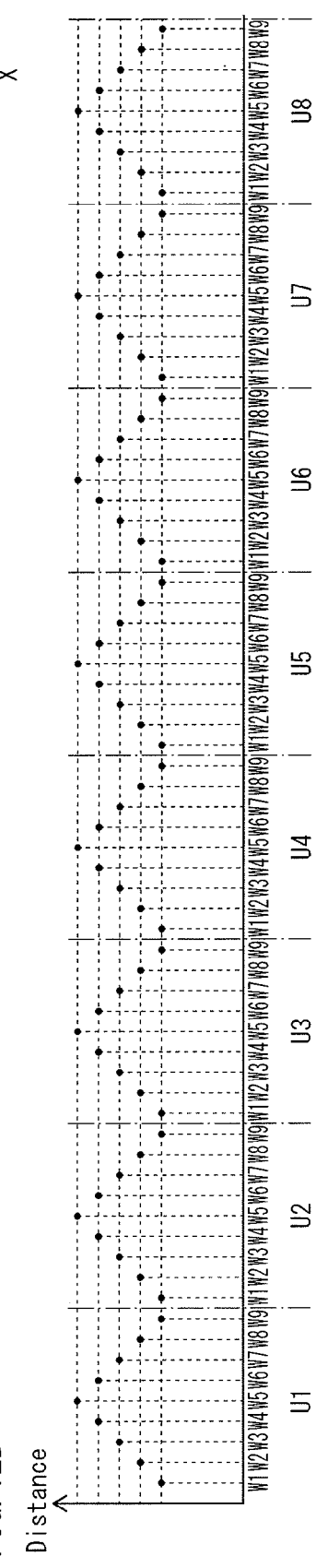
FIG. 12A
FIG. 12B

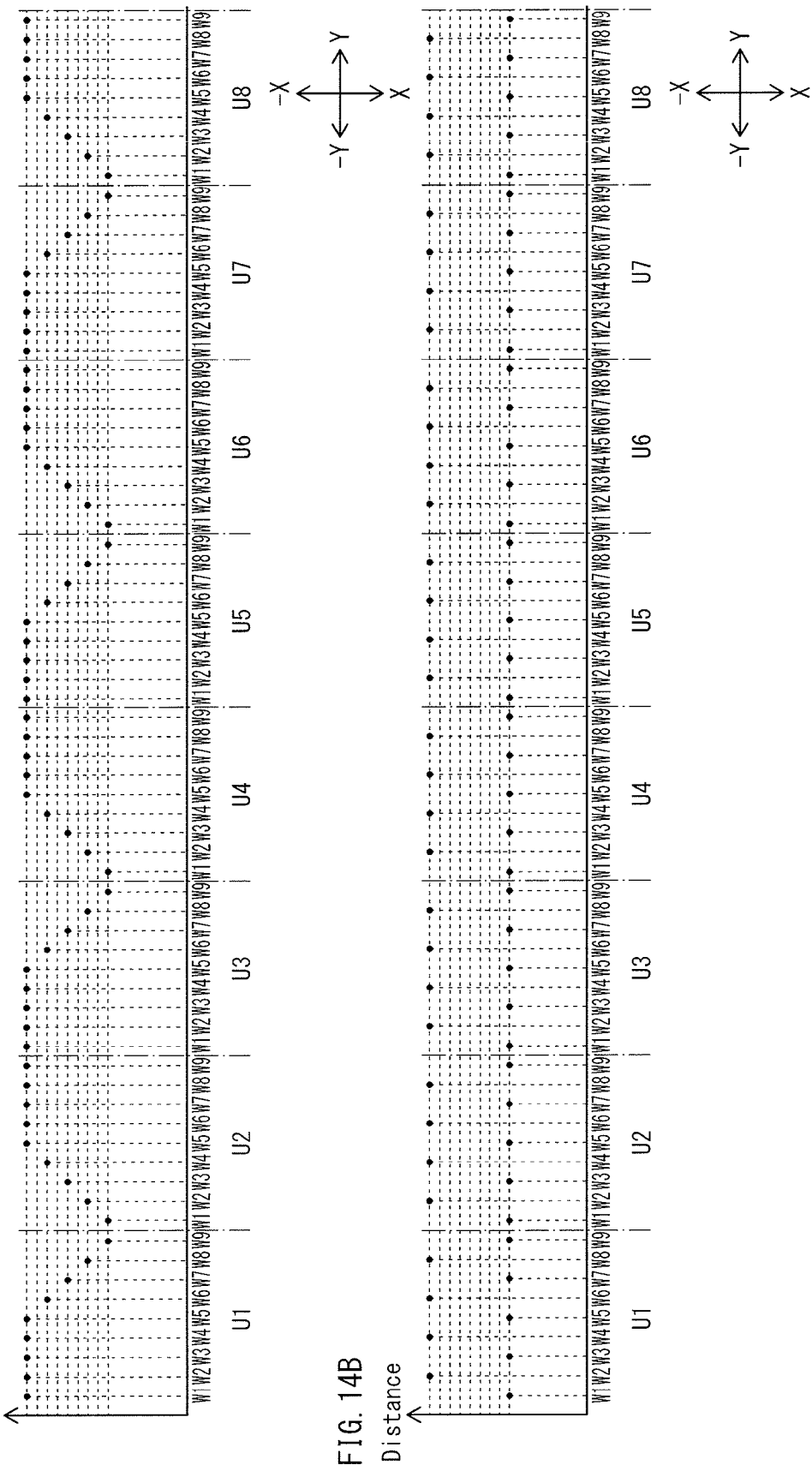

FIG. 17A
1003
FIG. 17B
1004
FIG. 17C
1005
FIG. 17D
1006
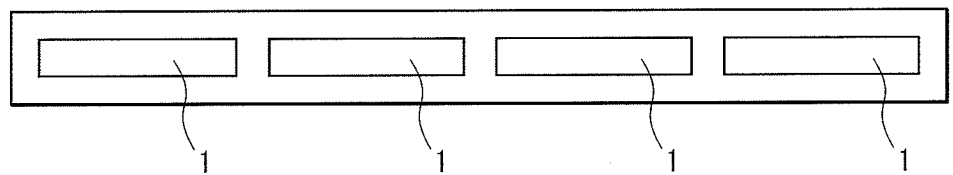
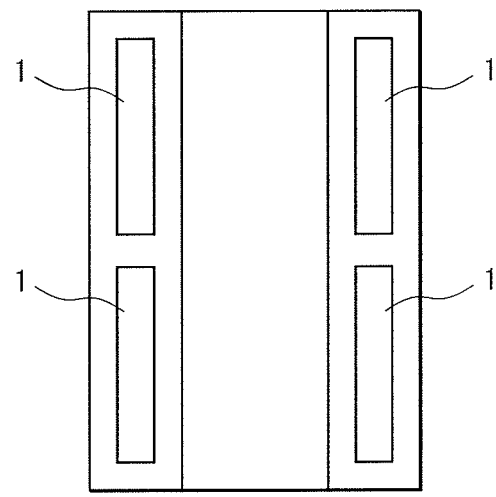
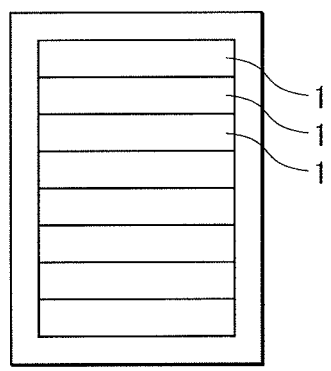
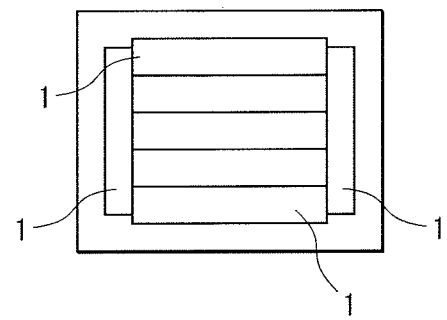

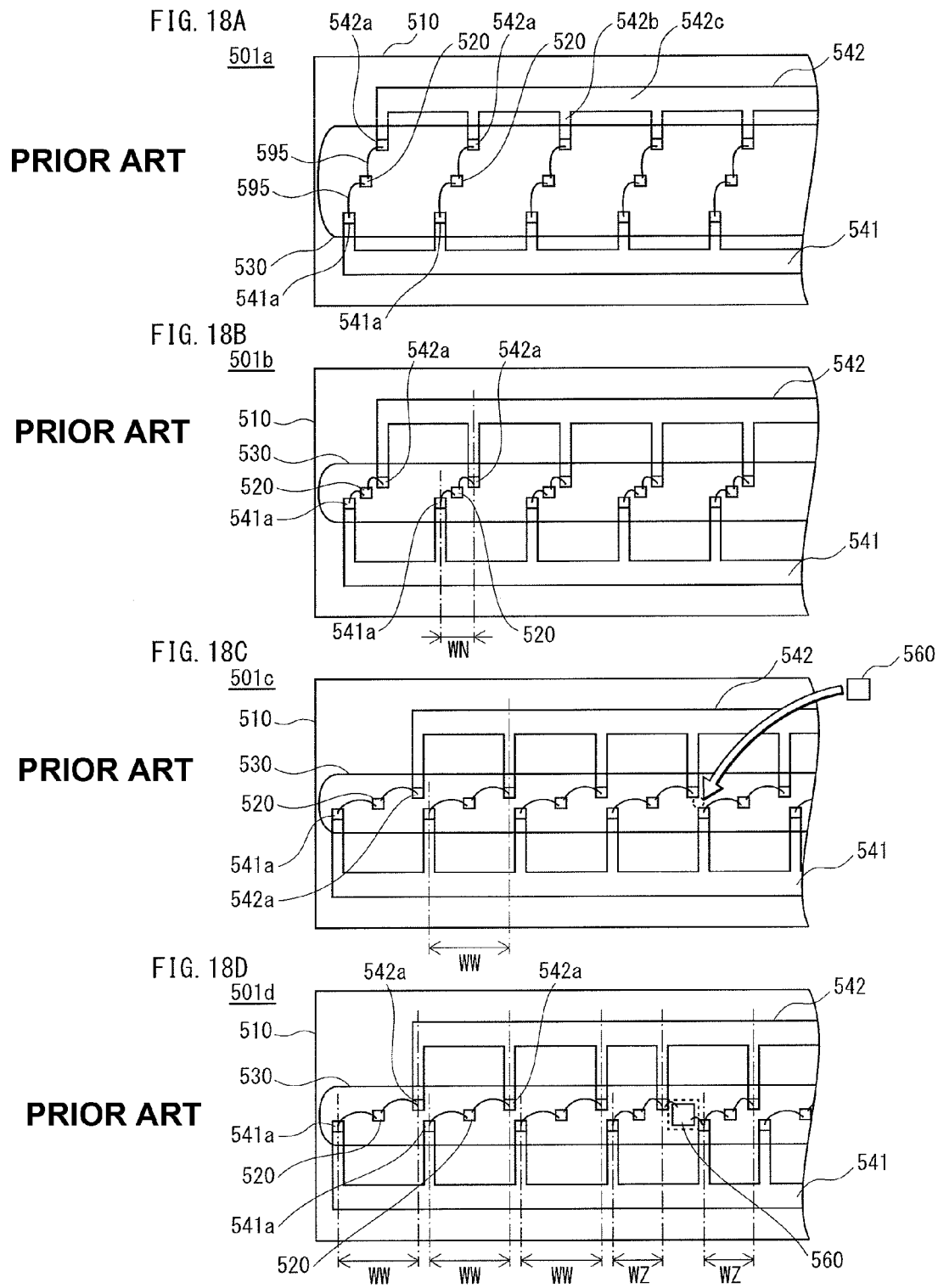

LIGHT-EMITTING DEVICE EACH HAVING VARIABLE DISTANCES BETWEEN PAIRS OF ELECTRODE PADS WITH RESPECT TO ZENER DIODES AND LIGHTING APPARATUS USING THE SAME

TECHNICAL FIELD

The present invention relates to technology for providing a light-emitting device including a plurality of light-emitting elements such as LEDs (light-emitting diodes), and a lighting apparatus using such a light-emitting device.

BACKGROUND ART

In recent years, with a growing demand for conservation of resources in the field of light source devices such as halogen light bulbs and fluorescent lamps, light-emitting devices utilizing LEDs with power-saving capabilities and long life have been provided.

With respect to light-emitting devices that can be used as light sources of various light source devices, an increase in luminance is highly desirable. Proposed as an example of light-emitting devices that achieve the increase in luminance is a light-emitting device including a plurality of LEDs that are arranged on a substrate in a row and are connected with one another (see Patent Literatures 1 and 2).

In a light-emitting device disclosed in Patent Literature 2, a plurality of LEDs are arranged on a substrate in two rows and are connected in series by wires, and all the LEDs and wires are sealed together by a sealing member.

Considered as one example of such a light-emitting device is a light-emitting device 501a having configuration as illustrated in FIG. 18A. In this configuration, a plurality of LEDs 520 are arranged in a row on a substrate 510 in the shape of an elongated rectangular plate. Pairs of electrode pads 541a and 542a are formed on the substrate 510 in one-to-one correspondence to the LEDs 520 such that electrode pads 541a and 542a are provided at opposites sides of a corresponding LED 520 in the widthwise direction of the substrate 510. The electrode pads 541a and 542a are electrically connected to the corresponding LED 520 by wires 595. Each electrode pad 541a is a part of first wiring 541, and each electrode pad 542a is a part of second wiring 542. The LEDs 520 are connected in parallel with one another by the first wiring 541, the second wiring 542, and the wires 595. The LEDs 520 and the pairs of electrode pads 541a and 542a are sealed by a sealing member 530 to prevent oxidation, corrosion, and the like.

In order to mount the LEDs 520 in a limited area on the substrate 510, it is necessary to increase a size of the sealing member 530 in the widthwise direction of the substrate 510 with increasing distance between the LEDs 520 and the respective pairs of electrode pads 541a and 542a in the widthwise direction of the substrate 510. With an increase in size of the sealing member 530, more material for the sealing member 530 becomes necessary, leading to an increase in material cost.

Considered to solve this problem is configuration as illustrated in FIG. 18B. In this configuration, each pair of electrode pads 541a and 542a is provided close to the corresponding LED 520, thereby reducing the size of the sealing member 530 in the widthwise direction of the substrate 510.

On a surface of the substrate 510 on which the LEDs 520 are mounted, an insulating film having a high light reflectance is formed to reflect light emitted from the LEDs 520. The wirings 541 and 542 have a lower light reflectance with respect to light in a visible region than the insulating film formed on the substrate 510. Since each pair of electrode pads 541a and 542a, which are respectively parts of the wirings 541 and 542, is provided close to the corresponding LED 520, and light emitted from the corresponding LED 520 is absorbed by the pair of electrode pads 541a and 542a, a light-extraction efficiency of a light-emitting device 501b is low.

Considered to address this problem is configuration as illustrated in FIG. 18C. In this configuration, a distance WW between the electrode pads 541a and 542a included in each pair is made longer than a distance WN between the electrode pads 541a and 542a included in each pair in the light-emitting device 501b.

FIGS. 19A and 19B each illustrate distribution of the intensity of light emitted from each LED 520, and a positional relation between the LED 520 and the corresponding pair of electrode pads 541a and 542a. FIGS. 19A and 19B respectively correspond to the configurations as illustrated in FIGS. 18C and 18B. In each of FIGS. 19A and 19B, an area enclosed by an alternate long and short dash line is an area in which the distribution of the intensity of light emitted from the LED 520 is 1/e, which is the maximum light intensity, or more (hereinafter, referred to as an "effective area".)

When the electrode pads 541a and 542a are located within the effective area as illustrated in FIG. 19B, an average light reflectance in the entire effective area is reduced accordingly, resulting in a decrease in light-extraction efficiency. In contrast, when the electrode pads 541a and 541b are not located within the effective area as illustrated in FIG. 19A, light in the effective area is fully reflected off the insulating film, leading to an increase in light-extraction efficiency.

As described above, the distance WW between the electrode pads 541a and 542a in each pair is longer and thus the average light reflectance in the entire effective area is higher in the light-emitting device 501c as illustrated in FIG. 18C than in the light-emitting device 501b as illustrated in FIG. 18B. As a result, an efficiency of extracting light emitted from the LEDs 520 is higher in the light-emitting device 501c than in the light-emitting device 501b.

The light-emitting device is typically provided with a protective element to prevent application of overvoltage (e.g. surge voltage) higher than rated voltage to each LED. This is important in terms of ensuring the reliability of the light-emitting device. One example of the protective element is a Zener diode. As with the LEDs, the Zener diode is required to be sealed by the sealing member to prevent corrosion and the like. When a Zener diode 560 is provided for the light-emitting device 501c as illustrated in FIG. 18C, the Zener diode 560 may be located apart, in the widthwise direction of the substrate 510, from the LEDs 520 arranged in a row, for example. In this case, however, since the size of the sealing member 530 increases as described above, the material cost might not be reduced. The Zener diode 560 may be sealed by a sealing member separate from the sealing member 530. In this case, however, it is necessary to add a step of providing the separate sealing member only for sealing the Zener diode 560. This can lead to a decrease in productivity. For the above-mentioned reasons, it is considered reasonable to locate the Zener diode 560 along a row of the LEDs 520 as shown by an arrow of FIG. 18C.

CITATION LIST

Patent Literature

[Patent Literature 1]
Japanese Patent Application Publication No. 63-44477
[Patent Literature 2]
Japanese Patent Application Publication No. 2008-244165

SUMMARY OF INVENTION

Technical Problems

In the above-mentioned case, however, since a distance between electrode pads is not long enough to locate the Zener diode 560, it is necessary to increase the distance. This is achieved by the configuration as illustrated in FIG. 18D. In this configuration, with respect to some of the LEDs 520 (the fourth and fifth LEDs 520 from the left in FIG. 18D), distances between the electrode pads 541a and 542a are reduced to allow a space for locating the Zener diode 560, and the Zener diode 560 is located in the space. In the light-emitting device 501d, a distance WZ between the electrode pads 541a and 542a one of which is electrically connected to the Zener diode 560 is made shorter than a distance WW between the other electrode pads 541a and 542a.

The light-emitting device 501d having the above-mentioned configuration gives rise to such problems that the light-extraction efficiency decreases in an area in which the Zener diode 560 is located, a localized reduction in luminance occurs, and unevenness in luminance becomes noticeable. The present invention has been conceived in view of the above-mentioned problems, and aims to provide a light-emitting device that can suppress unevenness in luminance.

Solution to Problem

In order to achieve the above-mentioned aim, a light-emitting device pertaining to the present invention includes: a substrate; a plurality of light-emitting elements arranged on the substrate in a row; electrode pad pairs formed on the substrate in one-to-one correspondence to the light-emitting elements, each electrode pad pair including two electrode pads located on the substrate at opposite sides of a corresponding light-emitting element in an arrangement direction of the light-emitting elements; protective elements provided in one-to-one correspondence to groups each constituted by at least three consecutive sets of light-emitting elements and electrode pad pairs corresponding thereto, each protective element being located between any two adjacent electrode pads included in different electrode pad pairs; and a sealing member provided on the substrate to seal the light-emitting elements, the electrode pad pairs, and the protective elements, wherein, in each group, a distance between two electrode pads included in an electrode pad pair corresponding to a light-emitting element located closest to the protective element is shorter than a distance between two electrode pads included in any other electrode pad pair, and a distance between two electrode pads included in each electrode pad pair varies between at least two electrode pad pairs other than the electrode pad pair corresponding to the light-emitting element located closest to the protective element.

Advantageous Effects of Invention

In the light-emitting device pertaining to the present invention, in each group, a distance between two electrode pads included in each electrode pad pair, which are located at opposite sides of a corresponding light-emitting element in the arrangement direction of the light-emitting elements, varies between at least two electrode pad pairs other than the electrode pad pair corresponding to the light-emitting element located closest to the protective element. With this configuration, in each group, a localized reduction in luminance in the vicinity of the protective element can be prevented, as a change in luminance occurs at a plurality of positions in the group. By enabling such luminance distribution that the change in luminance occurs at a plurality of positions in each group, the reduction in luminance in the vicinity of the protective element becomes less noticeable.

BRIEF DESCRIPTION OF DRAWINGS

FIG. 3A is a plan view illustrating the light-emitting device 1 pertaining to Embodiment 1, and FIG. 3B is an enlarged view of a part of the light-emitting device 1 enclosed by an alternate long and short dash line of FIG. 3A.

FIG. 5A is a plan view showing configuration of a part of the light-emitting device 1 pertaining to Embodiment 1, and FIG. 5B shows relations between positions of circuits U1 to U8 and electrode pads, and distances between electrode pads.

FIG. 11A is a plan view showing configuration of a part of a light-emitting device pertaining to Modification, and FIG. 11B shows relations between positions of circuits U1 to U8 and electrode pads, and distances between electrode pads.

FIG. 12A is a plan view showing configuration of a part of a light-emitting device pertaining to Modification, and FIG. 12B shows relations between positions of circuits U1 to U8 and electrode pads, and distances between electrode pads.

FIG. 14A shows relations between positions of circuits U1 to U8 and electrode pads, and distances between electrode pads in a light-emitting device pertaining to Modification, and FIG. 14B shows relations between positions of circuits U1 to U8 and electrode pads, and distances between electrode pads in a light-emitting device pertaining to another Modification.

FIGS. 17A, 17B, 17C, and 17D are plan views showing configurations of lighting apparatuses pertaining to Modifications.

FIGS. 18A, 18B, 18C, and 18D are plan views showing configurations of light-emitting devices used to explain technical problems.

DESCRIPTION OF EMBODIMENTS

Embodiment 1

<1> Configuration

Figure 1:
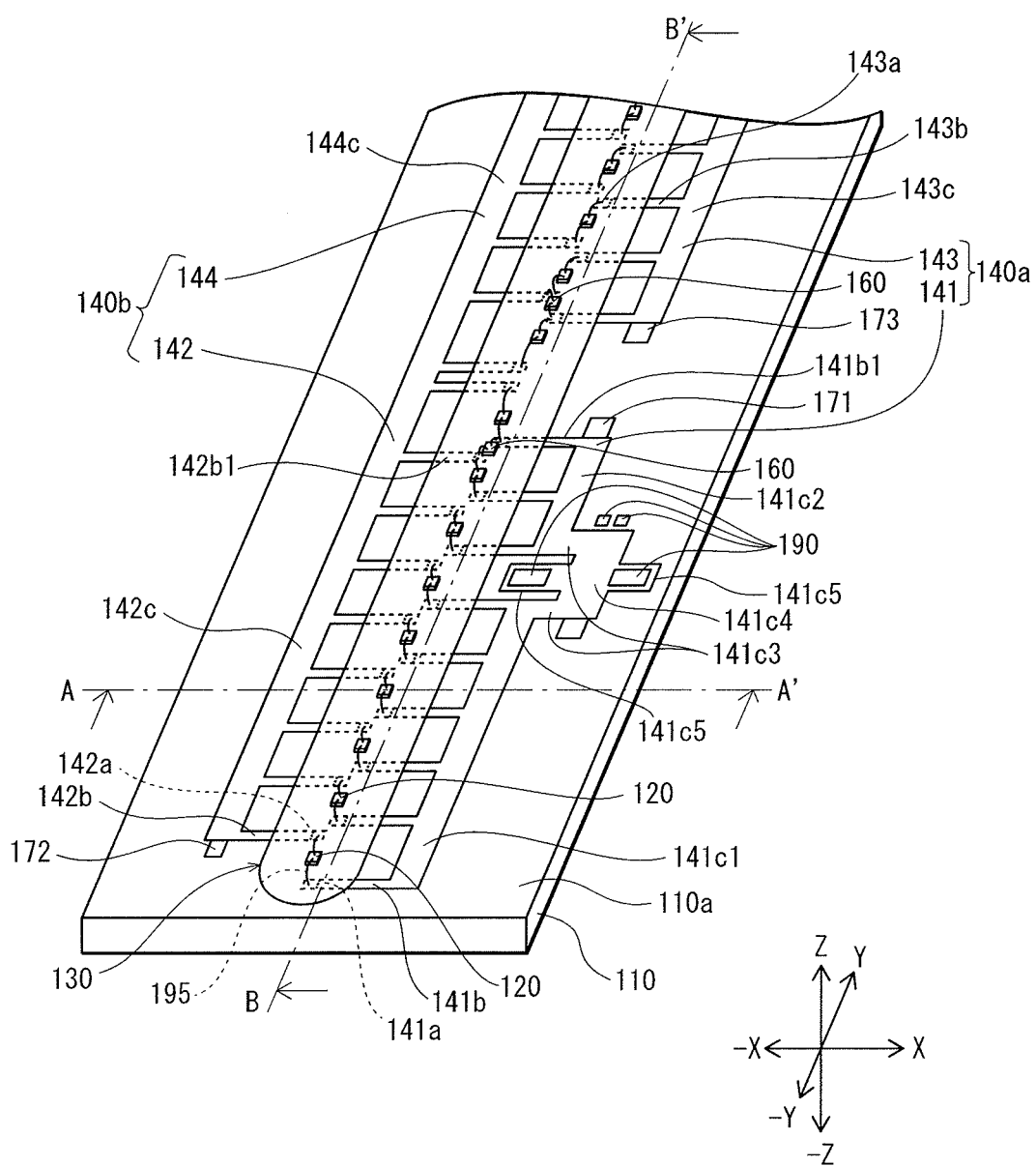
FIG. 1 is a perspective view illustrating a part of a light-emitting device 1 pertaining to Embodiment 1.
Figure 2A:
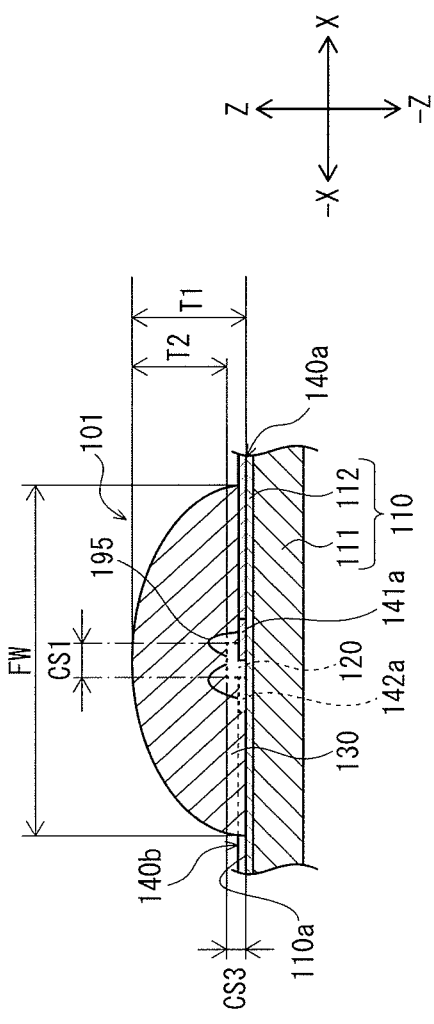
FIG. 2A is a cross-sectional view of a part of the light-emitting device 1 pertaining to Embodiment 1 taken along the line A-A' of FIG. 1.
Figure 2B:
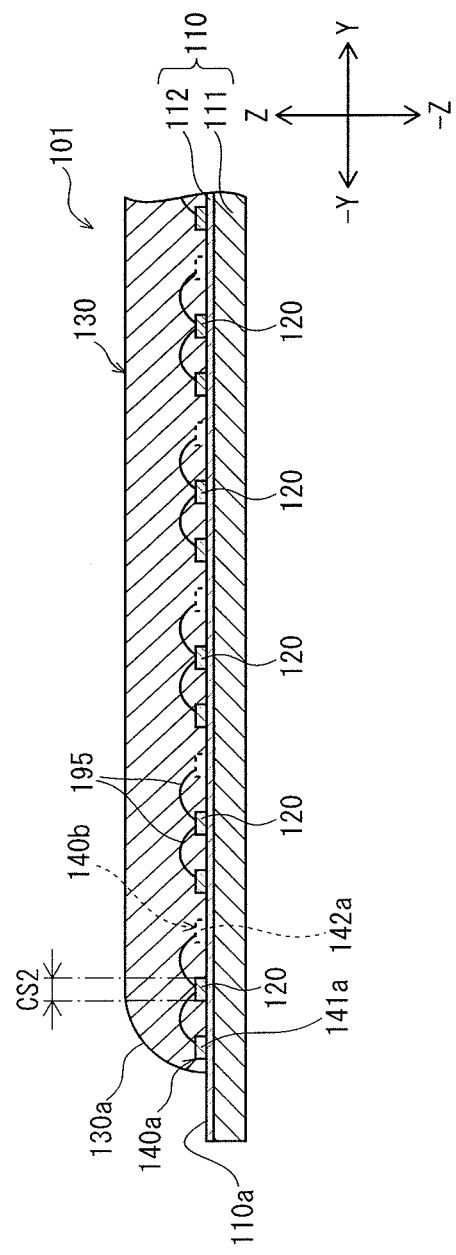
FIG. 2B is a cross-sectional view of a part of the light-emitting device 1 pertaining to Embodiment 1 taken along the line B-B' of FIG. 1.

FIG. 1 is a perspective view illustrating a part of a light-emitting device 1 pertaining to Embodiment 1. FIG. 2A is a cross-sectional view of the light-emitting device 1 taken along the line A-A' of FIG. 1 when viewed from a direction of arrows. FIG. 2B is a cross-sectional view of the part of the light-emitting device 1 taken along the line B-B' of FIG. 1 when viewed from a direction of arrows. FIG. 3A illustrates the light-emitting device 1 as a whole. FIG. 3B is an enlarged view of a part of the light-emitting device 1.

As illustrated in FIG. 1, the light-emitting device 1 includes a substrate 110, a plurality of LEDs (light-emitting elements) 120, first wiring 140a, second wiring 140b, Zener diodes 160, and a sealing member 130.

<1-1> Substrate

As illustrated in FIGS. 1 and 3A, the substrate 110 is in the shape of an elongated rectangular plate. When the substrate 110 is viewed from a direction perpendicular to a surface 110a of the substrate 110 on which the LEDs 120 are mounted (hereinafter, referred to as "in plan view"), the substrate 110 is approximately 15 mm in its widthwise direction (an X direction of FIGS. 1 and 3A), and is approximately 300 mm in its lengthwise direction (a Y direction of FIGS. 1 and 3A). As illustrated in FIGS. 2A and 2B, the substrate 110 includes a plate member 111 made of metal such as aluminium, and an insulating film 112 made, for example, of white polycarbonate resin. The insulating film 112 is formed over a surface of the plate member 111 and reflects light emitted from the LEDs 120.

Material for the substrate 110 and the shape of the substrate 110 are not particularly limited. Material having a high reflectance to light emitted from the LEDs 120 and excellent heat dissipation properties is preferably used for the substrate 110. Examples of such material include ceramics such as alumina.

The substrate 110 may have any shape that can be formed by combining lines and curvature. Specifically, the substrate 110 may have a polygonal shape including square and hexagonal shapes, a circular shape, and an elliptical shape.

<1-2> LED

Each of the LEDs 120 is a GaN-based LED that emits blue light. As illustrated in FIG. 1, the LEDs 120 are arranged on the substrate 110 in a row. The LEDs 120 are mounted on the substrate 110 such that a surface of each LED 120 on which an electrode (not illustrated) is not provided is in contact with the substrate 110 (i.e. with its face up). As illustrated in FIGS. 2A and 2B, each LED 120 is electrically connected by wires 195 to a corresponding pair of electrode pads 141a and 142a provided at opposite sides of the LED 120 in an arrangement direction of the LEDs 120. Each of the wires 195 is formed of gold, for example, and is connected to the electrode pad 141a or 142a at one end and is connected to an electrode of the LED 120 at the other end by well-know wire bonding. Each of the wires 195 extends along the arrangement direction of the LEDs 120. With this configuration, compared to configuration in which each of the wires 195 extends perpendicular to the element arrangement direction, the wires 195 are less likely to twist even when a force is applied in the element arrangement direction due to expansion and contraction of the sealing member 130 in its lengthwise direction. Each electrode pad 141a is a part of first wiring 140a, and each electrode pad 142a is a part of second wiring 140b. As illustrated in FIGS. 2A and 2B, each LED 120 is rectangular in plan view. In plan view, a size CS1 of each LED 120 in its widthwise direction and a size CS2 of the LED 120 in its lengthwise direction are each 0.3 mm to 1.0 mm, and a thickness CS3 of each LED 120 is 0.08 mm to 0.30 mm.

In the light-emitting device 1 pertaining to Embodiment 1, 72 LEDs 120 are arranged on the substrate 110 in a row. The number of LEDs 120 is not limited to 72, and may be more or less than 72.

<1-3> Wiring

As illustrated in FIG. 1, the first wiring 140a and the second wiring 140b are formed on the substrate 110 along the length of the substrate 110. The wirings 140a and 140b are made of a metal material, such as Ag and Cu. Material for the wirings 140a and 140b is not limited to the metal material. The wirings 140a and 140b may be made of a semiconductor material such as silicon and other conductive materials.

As illustrated in FIG. 3A, the first wiring 140a is composed of eight first partial wirings 141, 143, 145, 147, 149, 151, 153, and 155 arranged along the length of the substrate 110, and the second wiring 140b is composed of eight second partial wirings 142, 144, 146, 148, 150, 152, 154, and 156 arranged along the length of the substrate 110. The first partial wirings 141 and 155 respectively have connector mount pads 190 and 191 for mounting thereon two connectors (not illustrated). The two connectors are mounted to electrically connect two lead wires (not illustrated) derived from a power supply circuit (not illustrated) to the respective first partial wirings 141 and 155.

Figure 4:
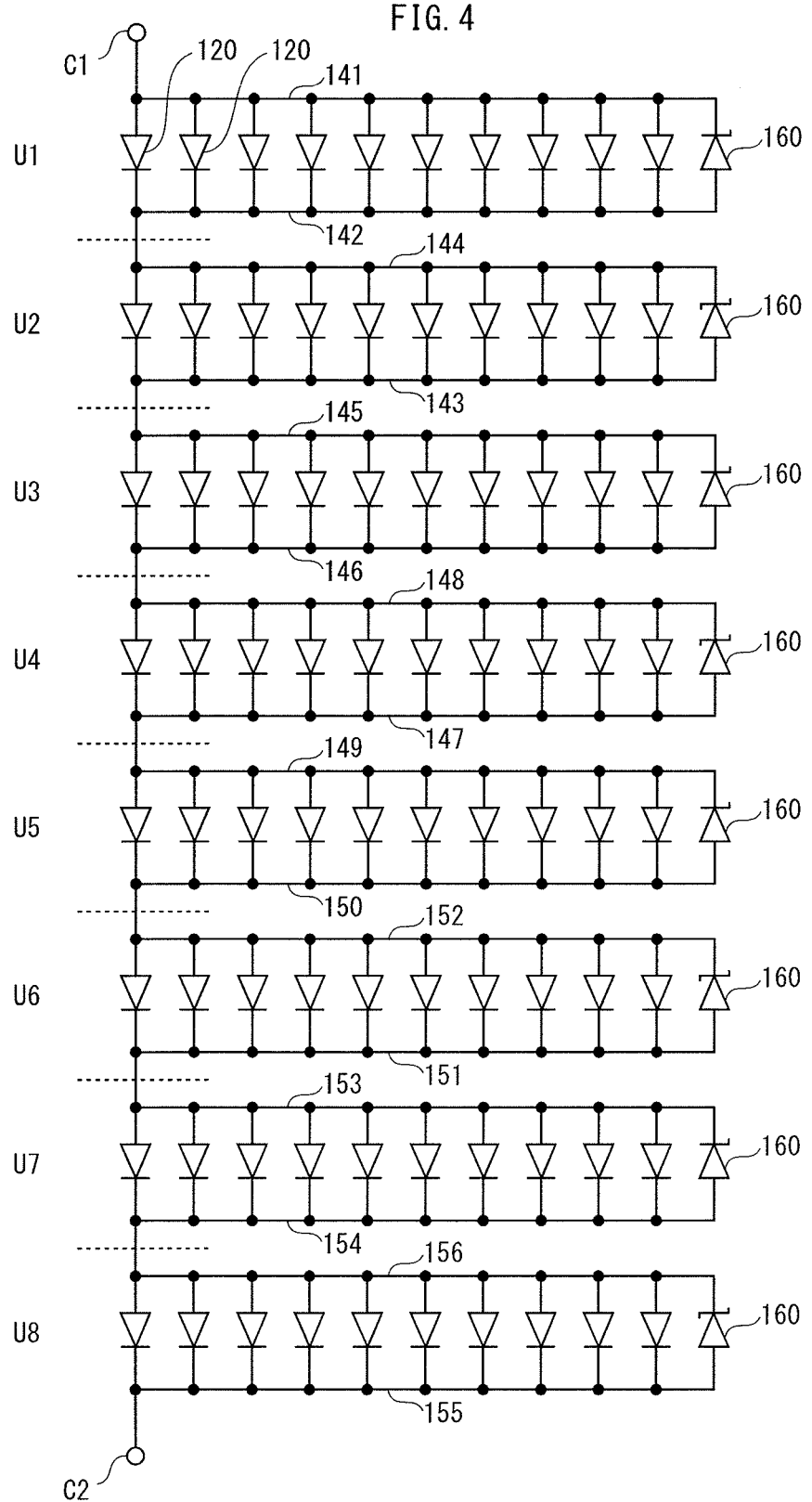
FIG. 4 is a circuit diagram of the light-emitting device 1 pertaining to Embodiment 1.

FIG. 4 is a circuit block diagram of the light-emitting device 1 pertaining to Embodiment 1.

As illustrated in FIG. 4, the first partial wiring 141, the second partial wiring 142, and nine LEDs 120 constitute a first circuit U1 in which the nine LEDs 120 are connected in parallel. Similarly, the first partial wiring 143 and the second partial wiring 144, the first partial wiring 145 and the second partial wiring 146, the first partial wiring 147 and the second partial wiring 148, the first partial wiring 149 and the second partial wiring 150, the first partial wiring 151 and the second partial wiring 152, the first partial wiring 153 and the second partial wiring 154, and the first partial wiring 155 and the second partial wiring 156 respectively constitute a second circuit U2, a third circuit U3, a fourth circuit U4, a fifth circuit U5, a sixth circuit U6, a seventh circuit U7, and an eighth circuit U8, along with nine LEDs 120 connected in parallel. The first partial wiring 141 as a part of the first circuit U1 is electrically connected to a terminal C1 of one of the two connectors via the connector mount pad 190, and the first partial wiring 155 as a part of the eighth circuit U8 is electrically connected to a terminal C2 of the other one of the two connecters via the connector mount pad 191.

As illustrated in FIGS. 1 and 3A, the first partial wiring 143 includes a main body 143c, nine legs 143b, and electrode pads 143a. The main body 143c has an elongated rectangular shape in plan view and extends along the length of the substrate 110. Each leg 143b has an elongated rectangular shape in plan view, and is continuous to the main body 143c at one end thereof. The other end of each leg 143b is located closer to the LEDs 120 than the one end is in the widthwise direction of the substrate 110. Each electrode pad 143a is rectangular in plan view, and is continuous to the other end of a corresponding leg 143b. The main body 143c of the first partial wiring 143 is continuous to a main body of the first partial wiring 145 at one end thereof in its lengthwise direction. An examination pad 173 is provided to be continuous to the other end of the main body 143c in its lengthwise direction. When the electrode pad 143a is referred to as the first electrode pad, the examination pad 173 is a second electrode pad different from the first electrode pad. As such, the first and second electrode pads have different applications.

The first partial wirings 145, 147, 149, 151, and 153 each have similar configuration to the first partial wiring 143, and respectively have examination pads 175, 177, 179, 181, and 183. Since the first partial wirings 145, 147, 149, 151, and 153 each have similar configuration to the first partial wiring 143, the description thereof is omitted.

As illustrated in FIGS. 1, 3A, and 3B, the first partial wiring 141 includes a first main body 141c1, a second main body 141c2, two first sub-bodies 141c3, a second sub-body 141c4, two extensions 141c5, nine legs 141b, and nine electrode pads 141a. The first main body 141c1 and the second main body 141c2 each have an elongated rectangular shape in plan view, and extend along the length of the substrate 110. The two first sub-bodies 141c3 extend, from an end of the first main body 141c1 and an end of the second main body 141c2 opposing each other, away from the LEDs 120 in the widthwise direction of the substrate 110. The second sub-body 141c4 is rectangular in plan view, and extends along the length of the substrate 110 so as to connect an end of one of the first sub-bodies 141c3 opposing an end continuous to the first main body 141c1 and an end of the other one of the first sub-bodies 141c3 opposing an end continuous to the second main body 141c2. The two extensions 141c5 extend from opposite sides of the second sub-body 141c4 in the widthwise direction thereof. Each leg 141b has an elongated rectangular shape in plan view, is continuous to the first main body 141c1 or the second main body 141c2 at one end thereof, and extends in the widthwise direction of the substrate 110. Each electrode pad 141a is rectangular in plan view, and is provided to be continuous to the other end of each leg 141b. The second main body 141c2 is located closer to the first partial wiring 143 than the second main body 141c1 is. An examination pad 171 is continuous to an end of the second main body 141c2 opposing the first partial wiring 143. The examination pad 171 is a member for feeding power to the LEDs 120. The examination pad 171 is not an electrode pad used to cause the LEDs 120 to constantly light but an electrode pad used to examine whether or not the LEDs 120 have any trouble with lighting operations. One of the extensions 141c5 located closer to the LEDs 120 is located within an area enclosed by the first sub-bodies 141c3 and the second sub-body 141c4. At respective ends of the extensions 141c5 and at an end of the second sub-body 141c4 located closer to the examination pad 171, connector mount pads 190 each for mounting thereon a connector (not illustrated) are formed. Each connector mount pad 190 is rectangular in plan view.

As illustrated in FIG. 3A, the first partial wiring 155 has similar configuration to the first partial wiring 141, and has an examination pad 185 and connector mount pads 191. Since the first partial wiring 155 and the connector mount pads 191 respectively have similar configuration to the first partial wiring 141 and the connector mount pads 190, description thereof is omitted. The two connectors are electrically connected to respective lead wires (not illustrated) derived from the power supply circuit (not illustrated). When the two connectors are mounted on the respective connector mount pads 190 and 191, the connector mount pads 190 and 191 are electrically connected to the respective lead wires derived from the power supply circuit. DC power is supplied between the connector mount pads 190 and 191 from the power supply circuit.

As illustrated in FIGS. 1, 3A and 3B, the second partial wiring 142 includes a main body 142c, nine legs 142b, and electrode pads 142a. The main body 142c has an elongated rectangular shape in plan view and extends along the length of the substrate 110. Each leg 142b has an elongated rectangular shape in plan view, and is continuous to the main body 142c at one end thereof. The other end of each leg 142b is located closer to the LEDs 120 than the one end is in the widthwise direction of the substrate 110. Each electrode pad 142a is rectangular in plan view, and is continuous to the other end of a corresponding leg 142b. The main body 142c of the second partial wiring 142 is continuous to a main body 144c of the second partial wiring 144 at one end thereof in its lengthwise direction. An examination pad 172 is provided to be continuous to the other end of the main body 142c in its lengthwise direction. The second partial wirings 144, 146, 148, 150, 152, 154, and 156 each have similar configuration to the second partial wiring 142, and respectively have examination pads 174, 176, 178, 180, 182, 184, and 186. Since the second partial wirings 144, 146, 148, 150, 152, 154, and 156 each have similar configuration to the second partial wiring 142, the description thereof is omitted.

As illustrated in FIG. 3A, in the light-emitting device 1 pertaining to Embodiment 1, a wiring extending from the connector mount pad 190 to the connector mount pad 191 has no wiring extending in a direction from the connector mount pad 191 to the connector mount pad 190 (a so-called return wiring). This configuration can reduce the number of wirings arranged in the widthwise direction of the substrate 110. Accordingly, a size of the substrate 110 in its widthwise direction can be reduced, leading to miniaturization of the light-emitting device 1.

With the exception of the electrode pads, the examination pads, and the connector mount pads, the first partial wirings 141, 143, 145, 147, 149, 151, 153, and 155, and the second partial wirings 142, 144, 146, 148, 150, 152, 154, and 156 are covered with a protective film (not illustrated) made from glass. This prevents corrosion of the first partial wirings and the second partial wirings, and improves adhesion of the first partial wirings and the second partial wirings to the substrate.

The examination pads 171 to 186 in Embodiment 1 are used to measure resistance between both ends of each of the first circuit U1 to the eighth circuit U8. For example, by examining changes in resistance between both ends of the first circuit U1, failures of the nine LEDs 120 included in the first circuit U1 due to leakage can be detected. For example, when resistance of any one of the LEDs 120 reduces due to an increase of the leakage current, resistance of the first circuit U1 as a whole reduces accordingly. As a result, it is possible to detect a failure. The examination pads 171 to 186 are provided for the respective first circuit U1 to the eighth circuit U8. With this configuration, compared to configuration in which an examination pad pair is provided for each of the LEDs 120 constituting the first circuit U1 to the eighth circuit U8, a failure of each LED 120 can be detected with more accuracy.

Furthermore, the examination pads 171 to 186 are not provided in a current path from the connector mount pads 190 to the connector mount pads 191 through the LEDs 120. With this configuration, for example, when examination is conducted by using an examination device, if the examination pads 171 to 186 are partially scratched upon contact with a probe of the examination device with pressure, the above-mentioned current path is not affected by an increase in resistance at the examination pads 171 to 186. This means that, even when the examination pads 171 to 186 are partially scratched during examination by the probe of the examination device and the like, luminance performance of the light-emitting device 1 and the like are not affected.

<1-4> Zener Diode

As illustrated in FIG. 1, the Zener diode 160 is provided between (i) an electrode pad 141a continuous to a leg 141b1 located in one end portion of the first partial wiring 141 closer to the second circuit U2 and (ii) an electrode pad 142a continuous to a leg 142b1 of the second partial wiring 142 located closest to the leg 141b1. The Zener diode 160 is electrically connected to the electrode pads 141a and 142a located at ends of the respective legs 141b1 and 142b1 by wires 195. As illustrated in FIG. 4, the Zener diode 160 is provided for each of the first circuit U1 to the eighth circuit U8 so as to be connected in parallel to the LEDs 120.

The Zener diode 160 provided for the first circuit U1 is electrically connected to the electrode pad 141a continuous to the leg 141b1 of the first partial wiring 141 located closest to the second circuit U2. The Zener diode 160 provided for the second circuit U2 is electrically connected to an electrode pad continuous to a leg 143b1 of the first partial wiring 143 located closest to the first circuit U1. The Zener diode 160 provided for the third circuit U3 is electrically connected to an electrode pad continuous to a leg 145b1 of the first partial wiring 145 located closest to the fourth circuit U4. The Zener diode 160 provided for the fourth circuit U4 is electrically connected to an electrode pad continuous to a leg 147b1 of the first partial wiring 147 located closest to the third circuit U3. The Zener diode 160 provided for the fifth circuit U5 is electrically connected to an electrode pad continuous to a leg 149b1 of the first partial wiring 149 located closest to the sixth circuit U6. The Zener diode 160 provided for the sixth circuit U6 is electrically connected to an electrode pad continuous to a leg 151b1 of the first partial wiring 151 located closest to the fifth circuit U5. The Zener diode 160 provided for the seventh circuit U7 is electrically connected to an electrode pad continuous to a leg 153b1 of the first partial wiring 153 located closest to the eighth circuit U8. The Zener diode 160 provided for the eighth circuit U8 is electrically connected to an electrode pad continuous to a leg 155b1 of the first partial wiring 155 located closest to the seventh circuit U7.

<1-5> Sealing Member

As illustrated in FIGS. 1 and 3A, the sealing member 130 is provided along the length of the substrate 110 so as to cover all of the 72 LEDs 120, the electrode pad pairs provided in one-to-one correspondence to the LEDs 120, and the wires 195 connecting the LEDs 120 and the electrode pad pairs. The sealing member 130 is made of a light-transmissive resin material containing phosphors. Examples of the light-transmissive resin material include silicone resin, fluororesin, silicone-epoxy hybrid resin, and urea resin. Powders of YAG phosphors ($(Y, Gd)_3Al_5O_{12}:Ce^{3+}$), silicate phosphors ($(Sr, Ba)_2SiO_4:Eu^{2+}$), nitride phosphors ($(Ca, Sr, Ba)AlSiN_3: Eu^{2+}$), oxynitride phosphors ($Ba_3Si_6O_{12}N_2:Eu^{2+}$), or the like may be used as the phosphors. As a result, blue light emitted from the LEDs 120 and yellow-green light emitted by converting part of the blue light by phosphors are mixed together to produce white light. The sealing member 130 does not necessarily have to contain phosphors. By sealing the LEDs 120, the electrode pads, and the wires 195 with the sealing member 130, deterioration of the LEDs 120, the electrode pads, and the wires 195 can be prevented.

As illustrated in FIG. 2A, a size FW of the sealing member 130 in the widthwise direction of the substrate 110 (a direction along the X axis in FIGS. 2A and 2B) is 0.8 mm to 3.0 mm. The sealing member 130 has a maximum thickness (a size in a direction along the Z axis) T1 including the thickness of each LED 120 of 0.4 mm to 1.5 mm, and a maximum thickness T2 not including the thickness of each LED 120 of 0.2 mm to 1.3 mm. In order to ensure sealing reliability of the sealing member 130, it is preferred that the size FW of the sealing member 130 be two to seven times larger than the size CS1 of each LED 120.

As illustrated in FIG. 2A, the sealing member 130 has a substantially semielliptical cross-section along the widthwise direction of the substrate 110. An end 130a of the sealing member 130 in its lengthwise direction is formed to be curved. With this configuration, stress concentration at the end 130a of the sealing member 130 is less likely to occur, and it becomes easy to extract light emitted from the LEDs 120 from the sealing member 130.

A method for forming the sealing member 130 having the curved end 130a as described above is not particularly limited. For example, the sealing member 130 can easily be formed by applying a sealing member precursor paste to a desired target to be covered (e.g. the LEDs 120) by using a dispenser. The method for forming the sealing member 130 by using the dispenser is described in detail later.

<1-6> Structural Features of Light-Emitting Device

As illustrated in FIG. 3B, in the first circuit U1, the Zener diode 160 is provided between (i) the electrode pad 141a continuous to the leg 141b1 located in one end portion of the first partial wiring 141 closer to the second circuit U2 and (ii) the electrode pad 142a continuous to the leg 142b1 of the second partial wiring 142 located closest to the leg 141b1.

When the circuit U1 is taken as an example, as illustrated in FIG. 3B, the electrode pads 141a as parts of the first partial wiring 141 and the electrode pads 142a as parts of the second partial wiring 142 are alternately arranged in a row along the length of the substrate 110. The electrode pads 141a and electrode pads 142a adjacent to the respective electrode pads 141a form pairs. Each LED 120 is located in a middle portion of the distance between the electrode pads 141a and 142a included in a corresponding pair. In each of the other circuits U2, U3, . . . , U8, each LED 120 is located in a middle portion of the distance between electrode pads included in a corresponding pair.

As illustrated in FIG. 5A, in each of the circuits U1, U2, . . . , U8, a distance (W1 to W9) between electrode pads (e.g. electrode pads 141a and 142a in the circuit U1) provided at opposite sides of each LED 120 becomes shorter with decreasing distance to the Zener diode 160. Specifically, the distance becomes shorter in the order of the distances W1, W2, . . . , and W9 by a constant amount. For example, the nine LEDs 120 included in the first circuit U1 are referred to as LEDs 120A to 120H in order, from an LED located furthest from the second circuit U2 along the Y axis. In this case, the distance W1 between electrode pads 141a and 142a located at opposite sides of the LED 120A, which is located furthest from the second circuit U2, is longer than a distance between electrode pads included in any other electrode pad pair, and the distance W9 between electrode pads 141a and 142a located at opposite sides of the LED 120H, which is located closest to the second circuit U2, is shorter than a distance between electrode pads included in any other electrode pad pair. The distance between the electrode pads 141a and 142a gradually decreases in the order of the LEDs 120B, 120C, . . . , and 120I. That is to say, there is a gradual change in the distance between the electrode pads 141a and 142a. Since each LED 120 is located substantially in the middle portion of the distance between the electrode pads 141a and 142a included in a corresponding pair, a distance between neighboring light-emitting elements becomes shorter with decreasing distance to the Zener diode 160, according to the distance between the electrode pads 141a and 142a.

In each of the circuits U1, U2, . . . , U8, each LED 120 is located in a middle portion of the distance between electrode pads included in a corresponding pair. A distance between an LED 120 located closest to the Zener diode 160 and an LED 120 located opposite the Zener diode with the LED 120 located closest to the Zener diode 160 therebetween is shorter than any other distance between LEDs 120.

FIG. 5B shows, regarding the light-emitting device 1 pertaining to Embodiment 1, relations between the positions of the circuits U1 to U8 and positions of electrode pads included in each of the circuits U1 to U8, and distances between electrode pads. In FIG. 5B, the distances between electrode pads are shown on the vertical axis, and the positions of the circuits U1 to U8 and the positions of the electrode pads included in each circuit are shown on the horizontal axis. For the positions of the circuits U1 to U8 and positions of electrode pads included in each of the circuits U1 to U8 shown on the horizontal axis, see FIGS. 3A and 3B.

As shown in FIG. 5B, in the light-emitting device 1, the distances W1 to W9 between electrode pads included in each electrode pad pair become shorter with decreasing distance to boundaries between the first circuit U1 and the second circuit U2, boundaries between the third circuit U3 and the fourth circuit U4, boundaries between the fifth circuit U5 and the sixth circuit U6; and boundaries between the seventh circuit U7 and the eighth circuit U8, reflecting the positions of the Zener diodes 160. Furthermore, in the light-emitting device 1, 72 LEDs 120 are divided into groups corresponding to eight circuits U1 to U8, and are located such that a distance between electrode pads gradually decreases in each of the circuits U1 to U8. With such a structure, since there is a gradual change in luminance in each of the circuits U1 to U8 included in the light-emitting device 1, unevenness in luminance becomes less noticeable compared to the configuration in which a localized reduction in luminance occurs.

<2> Method for Manufacturing Light-Emitting Device

The following describes a method for manufacturing the light-emitting device 1 pertaining to Embodiment 1.

Figure 6A:
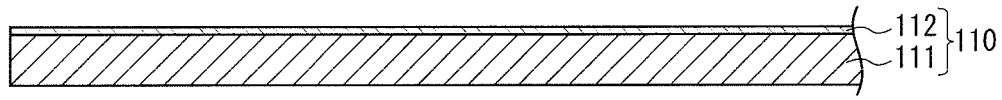
FIGS. 6A to 6G illustrate a method for manufacturing the light-emitting device 1 pertaining to Embodiment 1.

First, a resin film made of polycarbonate for forming the insulating film is heat-sealed on the plate member 111. As a result, the substrate 110 including the plate member 111 and the insulating film 112 formed over the surface of the plate member 111 is formed (see FIG. 6A).

Figure 6B:
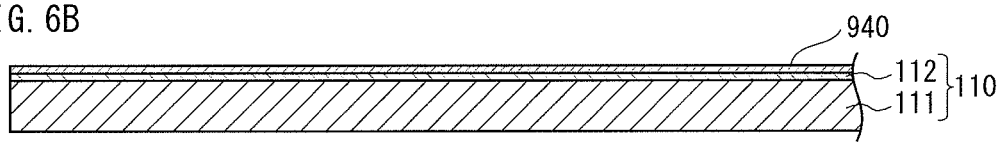
Figure 6C:
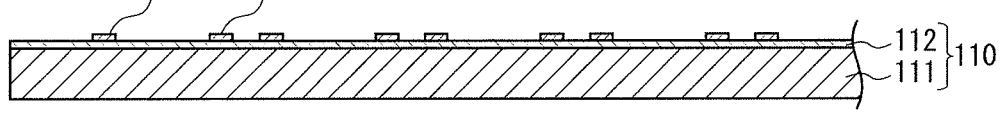

After a metal layer 940 for forming the wirings 140a and 140b is formed on the substrate 110 (see FIG. 6B), the wirings 140a and 140b are formed by utilizing photolithography and etching (see FIG. 6C). A glass film (not illustrated) is then formed to cover all of the substrate 110, and the wirings 140a and 140b. After a resist mask is formed to cover the glass film with the exception of portions of the wirings 140a and 140b corresponding to the electrode pads, the connector mount pads 190 and 191, and the examination pads, and the positions on which 72 LEDs 120 are to be provided by further utilizing photolithography and etching, the portions corresponding to the electrode pads, the connector mount pads 190 and 191, and the examination pads are removed by etching. As a result, the protective film covering the wirings 140a and 140b with the exception of the portions corresponding to the electrode pads, the connector mount pads 190 and 191, and the examination pads, and the positions on which the LEDs 120 are to be provided is formed.

Figure 6D:
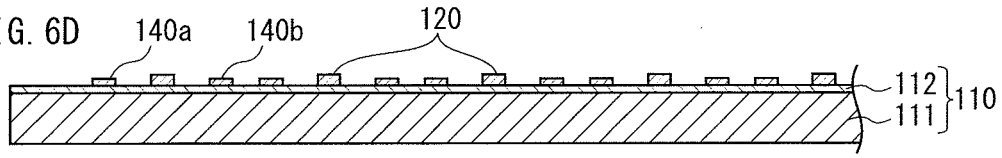

The LEDs 120 are then arranged on the substrate 110 (see FIG. 6D). In this step, the LEDs 120 are attached to the substrate 110 by an adhesive (not illustrated) made of a thermally conductive resin, for example.

Figure 6E:
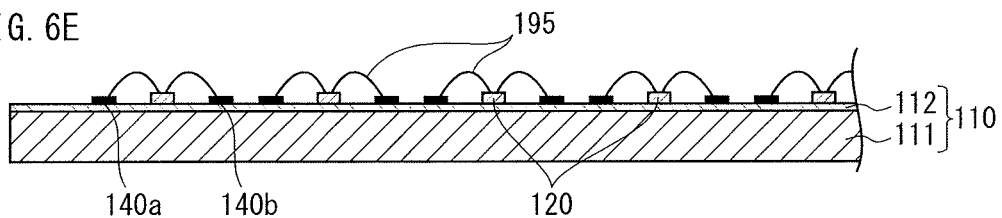

An electrode of each LED 120 is then electrically connected to electrode pads included in a corresponding pair via the wires 195 by wire bonding (see FIG. 6E).

Figure 6F:
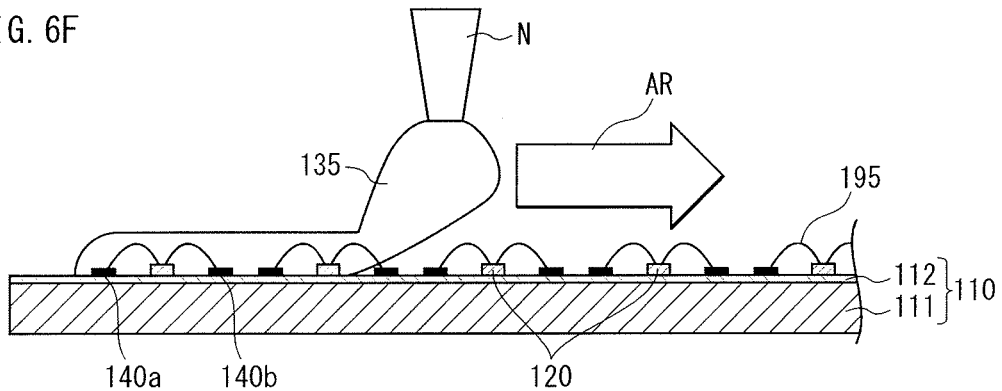
Figure 6G:
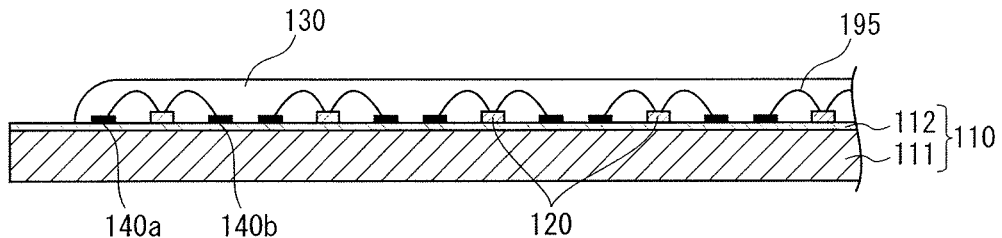

A resin paste 135 is then linearly applied along a row of the 72 LEDs 120 by using a dispenser N, for example (see an arrow AR of FIG. 6F). Then, by solidifying the resin paste 135, the sealing member 130 is formed (see FIG. 6G). In this step of applying the resin paste, for example, positions of two LEDs 120 at both ends of the row of the 72 LEDs 120 are obtained, the center of each LED 120 in the widthwise direction of the substrate 110 is calculated, and a straight line passing through any two calculated centers is identified as an arrangement axis of the row of the 72 LEDs 120 to perform dispensing along the arrangement axis.

As described above, a method for sealing a row of elements is not particularly limited in the present invention. It is however preferred that dispensing be utilized, because it is easy to collectively seal the LEDs 120, the electrode pads, the wires 195, and the Zener diodes that are provided close to one another on the substrate 110, thereby leading to productivity improvement.

The viscosity of the resin paste 135 is preferably in a range of 20 Pa·sec to 60 Pa·sec. When the viscosity is less than the range, the resin paste 135 might lose its shape immediately upon application. As a result, it is difficult to form the sealing member 130 in the intended shape. When the sealing member 130 cannot be formed in the intended shape, unevenness of color of emitted light can occur, and the wires 195 can partially be exposed from the sealing member 130. As a result, sealing reliability might not be maintained. By making the resin paste 135 to have a relatively high viscosity, i.e., 20 Pa·sec to 60 Pa·sec, as described above, the end 130a of the sealing member 130 in its lengthwise direction can be formed to be curved, or can be formed to have a substantially semielliptical cross-section along the widthwise direction of the substrate 110. Moreover, making the resin paste 135 to have a high viscosity produces advantageous effects that the phosphors contained in the resin paste 135 do not easily sink down, and, as a result, unevenness of color of emitted light can hardly occur. It should be noted that in order to control the viscosity, the resin paste 135 preferably contains at least 5 wt % of filler or phosphors. For example, white filler can be used. Furthermore, in order to maintain the shape of the sealing member 130, it is preferred that the sealing member 130 have a Shore A hardness of 20 or more.

<3> Summary

In conclusion, in the light-emitting device 1 pertaining to Embodiment 1, in each of the circuits U1, U2, . . . , U8, a distance between electrode pads in each pair provided at opposite sides of a corresponding LED 120 in the arrangement direction of the LEDs 120 varies between at least two LEDs 120 other than an LED 120 located closest to the Zener diode 160. With this configuration, in each of the circuits U1, U2, . . . , U8, a localized reduction in luminance in the vicinity of the Zener diode 160 can be prevented, as a change in luminance occurs at a plurality of positions in each of the circuits U1, U2, . . . , U8. By enabling such luminance distribution that the change in luminance occurs at a plurality of positions in each of the circuits U1, U2, . . . , U8, the reduction in luminance in the vicinity of the Zener diode 160 becomes less noticeable.

In the light-emitting device 1, a distance between electrode pads included in a pair corresponding to an LED 120 located closest to the Zener diode 160 is shorter than a distance between electrode pads included in any other pair, and each LED 120 is located in a middle portion of a distance between electrode pads included in a corresponding pair. With this configuration, the density of the LEDs 120 necessarily increases in the vicinity of the Zener diode 160, and a reduction in luminance in the vicinity of the Zener diode 160 can be suppressed accordingly.

In the light-emitting device 1, there is a gradual change in the distance between the electrode pads 141a and 142a. With this configuration, in the first circuit U1, for example, the LED 120A located furthest from the Zener diode 160 has the highest light-extraction efficiency, and the LED 120H located closest to the Zener diode 160 has the lowest light-extraction efficiency. The light-extraction efficiency gradually decreases in the order of the LEDs 120B, 120C, ..., and 120I, and, with the decrease of the light-extraction efficiency, the luminance gradually decreases. Since there is a gradual change in luminance in each of the circuits U1 to U8, a reduction in luminance in the vicinity of the Zener diode 160 becomes less noticeable.

In each of the circuits U1, U2, ..., U8, the light-extraction efficiency decreases with decreasing distance to the Zener diode 160, as light emitted from the LED 120 is absorbed by the electrode pads. The density of the LEDs 120, however, increases with decreasing distance to the Zener diode 160, leading to an increase of the amount of light. As a result, in each of the circuits U1, U2, ..., U8, unevenness in luminance can be suppressed.

Embodiment 2

Figure 7:
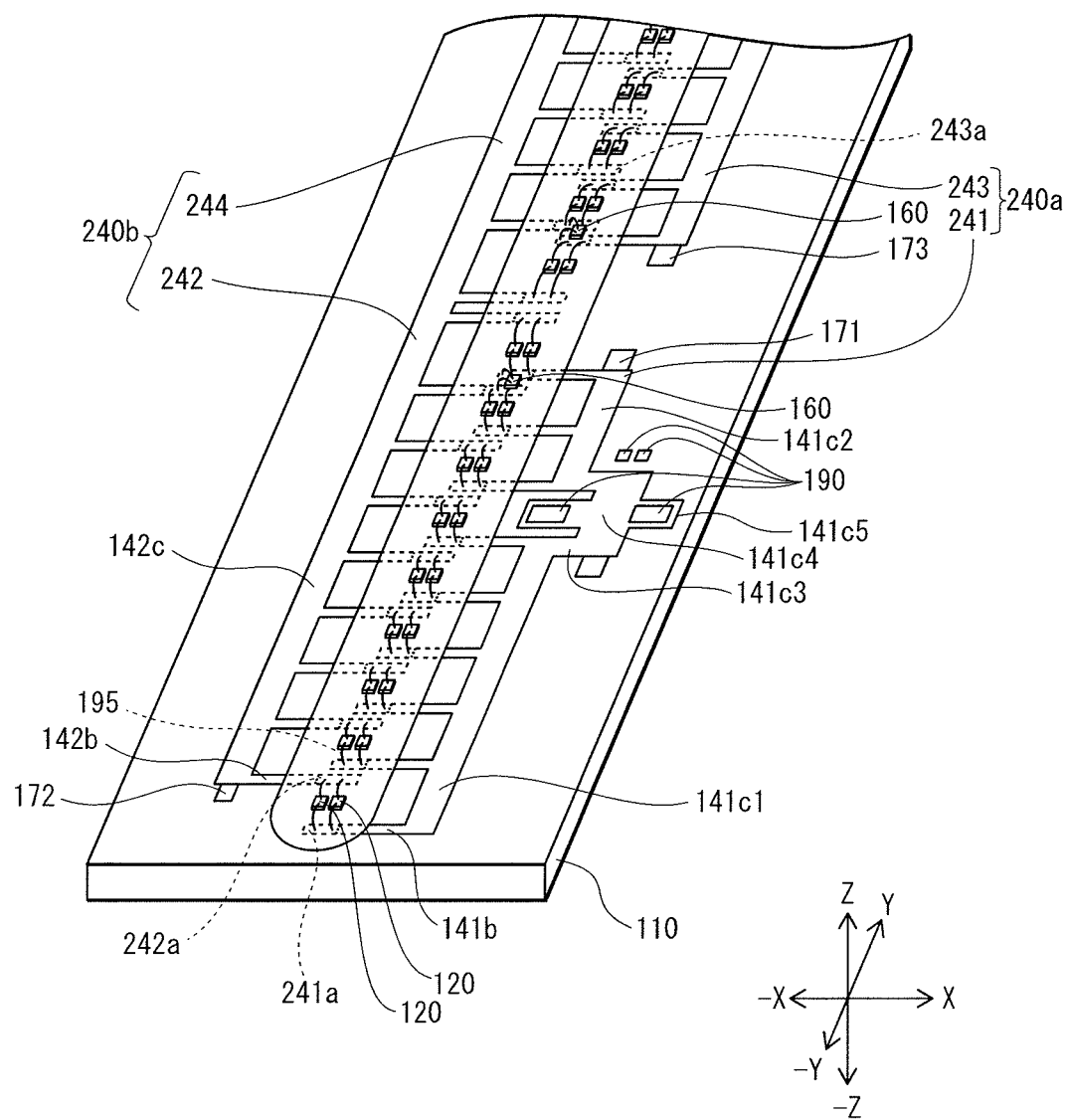
FIG. 7 is a perspective view illustrating a part of a light-emitting device 2 pertaining to Embodiment 2.

A light-emitting device 2 pertaining to Embodiment 2 includes components substantially similar to those in the light-emitting device 1 pertaining to Embodiment 1, and differs from the light-emitting device 1 in that the LEDs 120 are arranged in two rows as illustrated in FIG. 7. The components similar to those in Embodiment 1 are assigned with the same reference signs as those in Embodiment 1, and description thereof is omitted.

Figure 8:
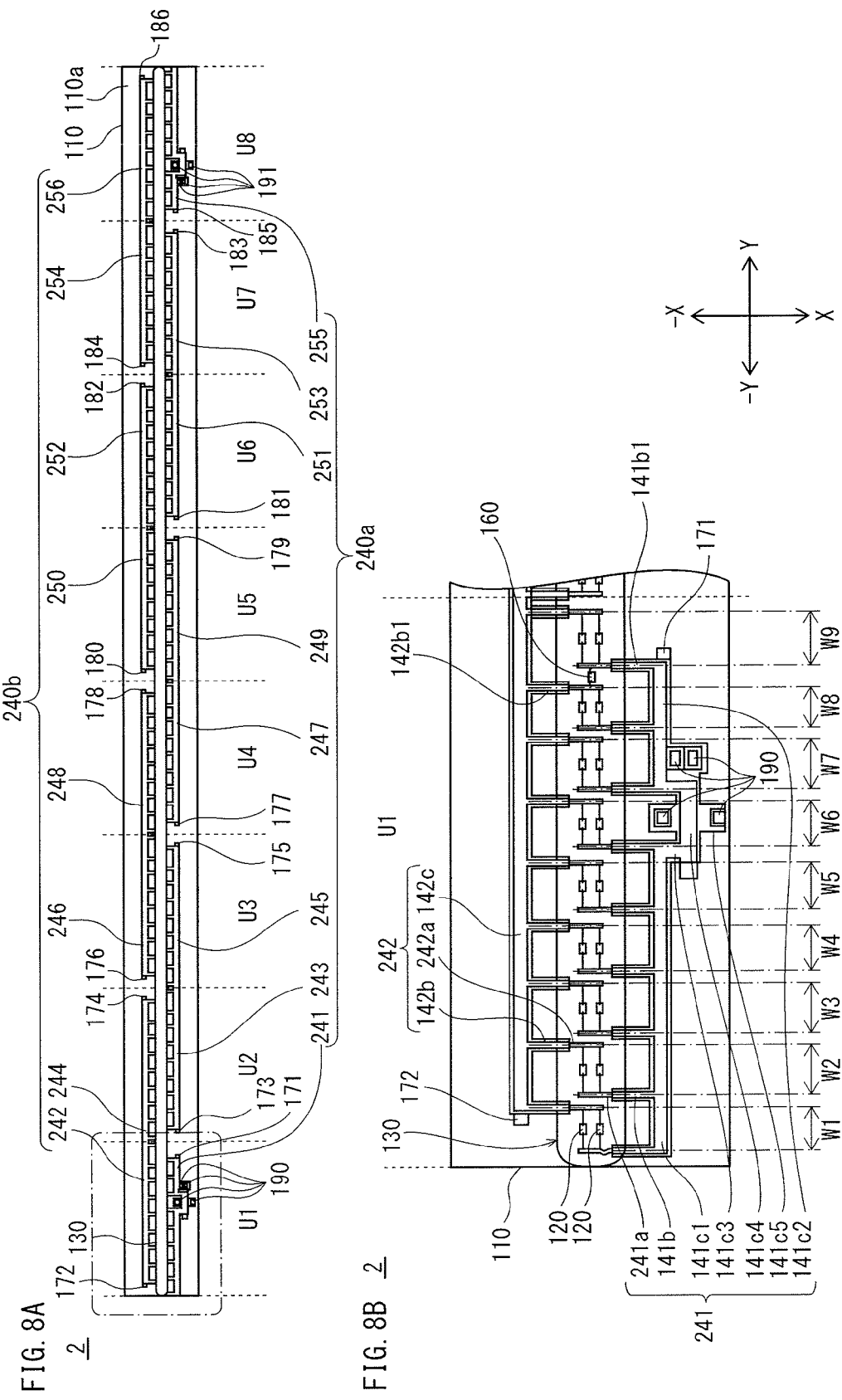
FIG. 8A is a plan view illustrating the light-emitting device 2 pertaining to Embodiment 2.
FIG. 8B is an enlarged view of a part of the light-emitting device 2 enclosed by an alternate long and short dash line of FIG. 8A.

As illustrated in FIG. 7, first wiring 240a and second wiring 240b are formed on the substrate 110 along the length of the substrate 110. As illustrated in FIG. 8B, the first wiring 240a is composed of eight first partial wirings 241, 243, 245, 247, 249, 251, 253, and 255, and the second wiring 240b is composed of eight second partial wirings 242, 244, 246, 248, 250, 252, 254, and 256.

The first partial wiring 243 has a substantially similar shape to the first partial wiring 143 pertaining to Embodiment 1, and differs from the first partial wiring 143 in that an electrode pad 243a is larger than the electrode pad 143a in size in the widthwise direction of the substrate 110. Since the first partial wirings 241, 245, 247, 249, 251, and 253 have similar configuration to the first partial wiring 243, the description thereof is omitted.

The second partial wiring 242 has a substantially similar shape to the second partial wiring 142 pertaining to Embodiment 1, and differs from the second partial wiring 142 in that an electrode pad 242a is larger than the electrode pad 142a in size in the widthwise direction of the substrate 110. Since the second partial wirings 244, 246, 248, 250, 252, 254, and 256 have similar configuration to the second partial wiring 242, the description thereof is omitted.

As illustrated in FIG. 8B, in the first circuit U1, similar to the light-emitting device 1 pertaining to Embodiment 1, the Zener diode 160 is provided between (i) the leg 141b1 located at one end of the first partial wiring 241 closer to the second circuit U2 and (ii) the leg 142b1 of the second partial wiring 142 located closest to the leg 141b1. The distance (W1 to W9) (see FIG. 8B) between electrode pads 241a and 242a provided at opposite sides of each LED 120 becomes shorter with decreasing distance to the Zener diode 160. Specifically, the distance decreases in the order of the distances W1, W2, ..., and W9 by a constant amount.

Embodiment 3

Figure 9:
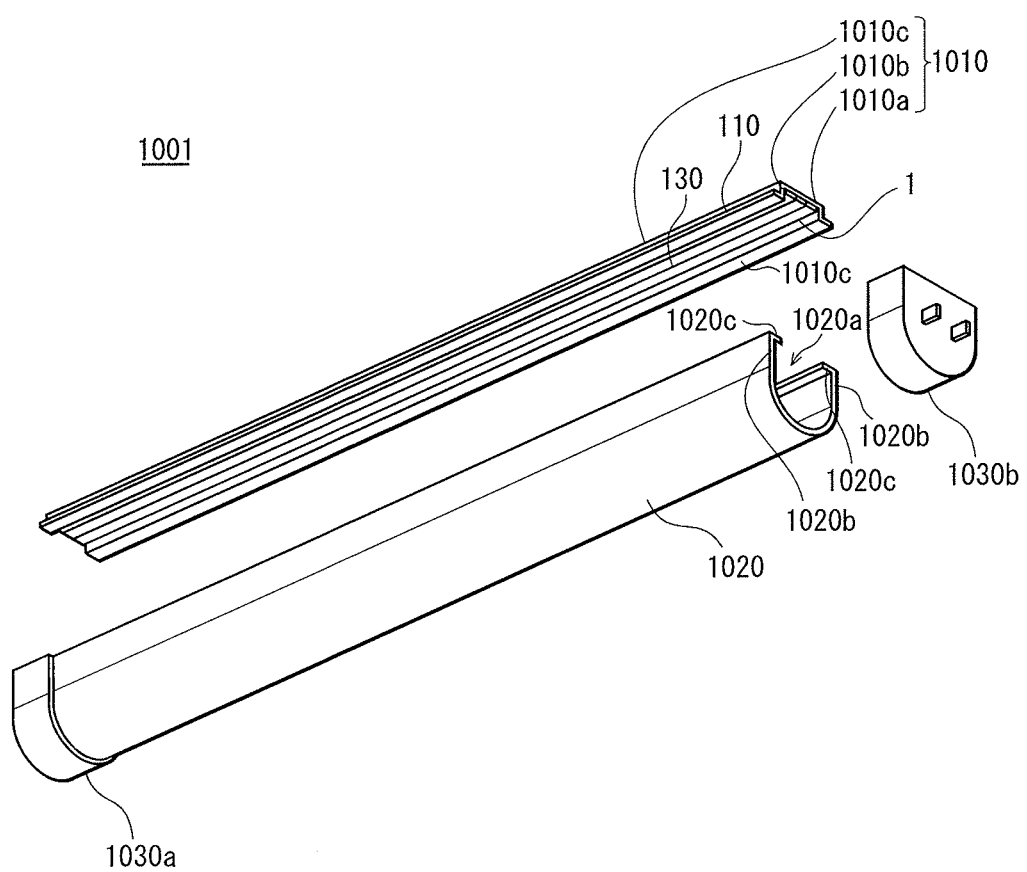
FIG. 9 is an exploded perspective view of a lighting apparatus 1001 pertaining to Embodiment 3.

FIG. 9 is an exploded perspective view illustrating a lighting apparatus 1001 pertaining to Embodiment 3.

As illustrated in FIG. 9, the lighting apparatus 1001 includes the light-emitting device 1 pertaining to Embodiment 1, an elongated case 1010 for housing therein the light-emitting device 1, a globe 1020 attached to the case 1010, and bases 1030a and 1030b attached to both ends of the case 1010 in its lengthwise direction.

The case 1010 includes a primary part 1010a, secondary parts 1010b, and flanged parts 1010c. The primary part 1010a has an elongated rectangular shape. The secondary parts 1010b stick out, in a direction along the thickness of the primary part 1010a, from both ends of the primary part 1010a in its widthwise direction. The flanged parts 1010c stick out from one ends of the secondary parts 1010b opposing ends continuous to the primary part 1010a so as to extend away from each other in a direction perpendicular to the secondary parts 1010b. The light-emitting device 1 is located in an area enclosed by the primary part 1010a and the secondary parts 1010b.

The globe 1020 has an elongated shape, and has substantially the same length as the case 1010. The globe 1020 has a U-shaped cross-section along a direction perpendicular to its lengthwise direction, and has an elongated opening 1020a along its lengthwise direction. Flanged parts 1020c stick out from both ends 1020b of the opening of the globe 1020 so as to extend toward each other. The globe 1020 is attached so as to cover a surface of the case 1010 on which the light-emitting device 1 is provided by latching the flanged parts 1020c onto the respective flanged parts 1010c provided to extend from the secondary parts 1010b of the case 1010.

The bases 1030a and 1030b are attached to respective ends of the case 1010 with the globe 1020 attached to the case 1010.

Described in Embodiment 3 is a case where the light-emitting device 1 pertaining to Embodiment 1 is included. In place of the light-emitting device 1, however, the light-emitting device 2 pertaining to Embodiment 2 may be included.

Embodiment 4

Figure 10:
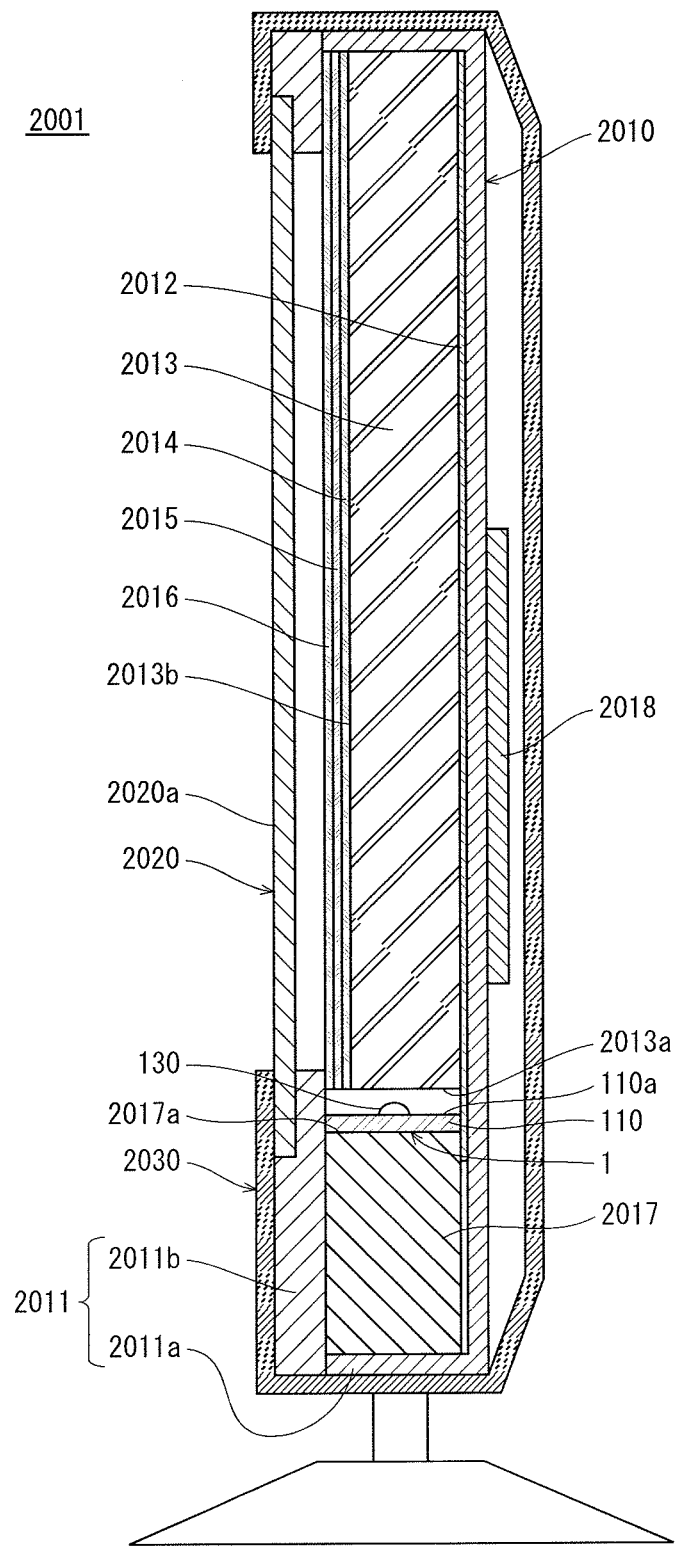
FIG. 10 is a cross-sectional view showing configuration of a liquid crystal display apparatus 2001 pertaining to Embodiment 4.

FIG. 10 is a cross-sectional view illustrating a liquid crystal display apparatus pertaining to Embodiment 4.

As illustrated in FIG. 10, a liquid crystal display apparatus 2001 includes an edge-lit back light unit 2010, an active matrix liquid crystal panel 2020, and a case 2030 for housing the back light unit 2010 and the liquid crystal panel 2020.

The back light unit 2010 includes a case 2011, a reflective sheet 2012, a light-guiding plate 2013, a diffusion sheet 2014, a prism sheet 2015, a polarizing sheet 2016, a heat sink 2017, a lighting circuit 2018, and the light-emitting device 1 described in Embodiment 1. The case 2011 includes a main body 2011a and a front frame 2011b.

The light-emitting device 1 is provided such that the surface 110a of the substrate 110 on which the sealing member 130 is provided faces a light entrance surface 2013a of the light-guiding plate 2013.

Described in Embodiment 4 is a case where the light-emitting device 1 pertaining to Embodiment 1 is included. In place of the light-emitting device 1, however, the light-emitting device 2 pertaining to Embodiment 2 may be included.

<Modifications>

(1) In Embodiment 1, as illustrated in FIG. 5A, eight Zener diodes 160 are located close to boundaries between the first circuit U1 and the second circuit U2, boundaries between the third circuit U3 and the fourth circuit U4, boundaries between the fifth circuit U5 and the sixth circuit U6, and boundaries between the seventh circuit U7 and the eighth circuit U8. As illustrated in FIG. 5B, in each circuit, a distance (W1 to W9)

between electrode pads 141a and 142a included in each electrode pad pair becomes shorter with decreasing distance to a corresponding one of the boundaries between the first circuit U1 and the second circuit U2, the boundaries between the third circuit U3 and the fourth circuit U4, the boundaries between the fifth circuit U5 and the sixth circuit U6, and the boundaries between the seventh circuit U7 and the eighth circuit U8, reflecting the position of the Zener diode 160. The Zener diodes 160, however, may not be arranged in this manner.

For example, the eight Zener diodes 160 may be located close to substantially middle portions of the respective circuits U1 to U8 along the length of the substrate 110 (a direction along the Y axis in FIGS. 11A and 11B) (see FIG. 11A). As illustrated in FIGS. 11A and 11B, in each of the circuits U1 to U8, a distance (W1 to W9) between electrode pads 141a and 142a included in each electrode pad pair may become shorter with decreasing distance to the substantially middle portion of the circuit, reflecting the position of the Zener diode 160.

Alternatively, the eight Zener diodes 160 may be located in one end portions of the respective circuits U1 to U8 along the length of the substrate 110 (along the Y axis in FIGS. 12A and 12B) (see FIG. 12A). As illustrated in FIGS. 12A and 12B, in each of the circuits U1 to U8, a distance (W1 to W9) between electrode pads 141a and 142a included in each electrode pad pair may be the longest in a substantially middle portion of the circuit, and may become shorter with decreasing distance to the one end portion of the circuit, reflecting the position of the Zener diode 160.

Figure 13A:
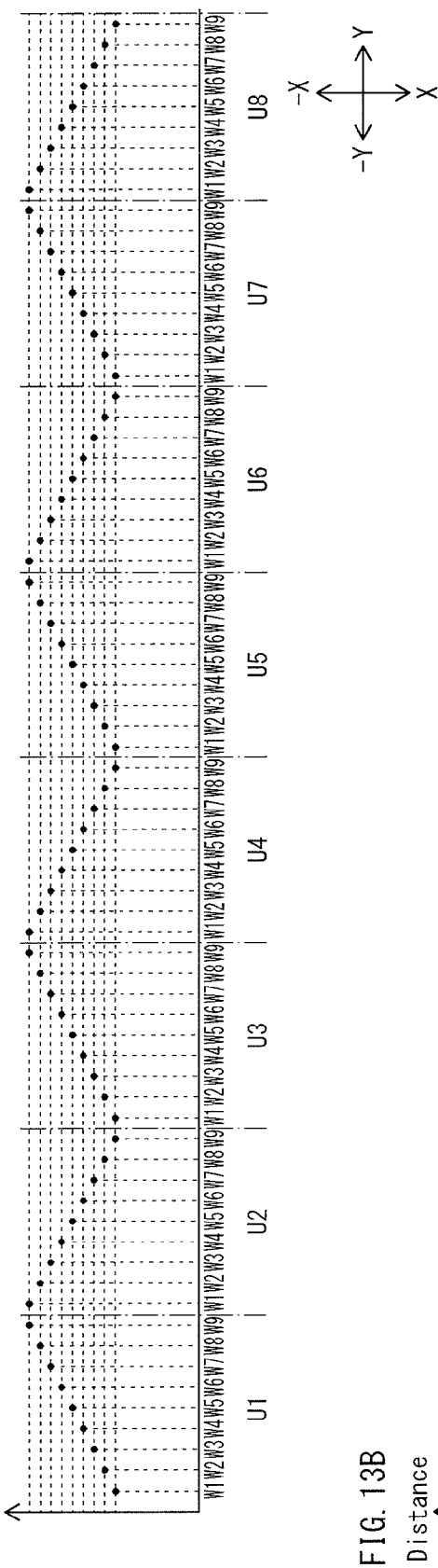
FIG. 13A shows relations between positions of circuits U1 to U8 and electrode pads, and distances between electrode pads in a light-emitting device pertaining to Modification.

Furthermore, the eight Zener diodes 160 may be located close to one end portion of the first circuit U1 opposite to the second circuit U2, boundaries between the second circuit U2 and the third circuit U3, boundaries between the fourth circuit U4 and the fifth circuit U5, and boundaries between the sixth circuit U6 and the seventh circuit U7, and one end portion of the eighth circuit U8 opposite to the seventh circuit U7. As illustrated in FIG. 13A, a distance between electrode pads included in each electrode pad pair may become shorter with decreasing distance to the one end portion of the first circuit U1 opposite to the second circuit U2, the boundaries between the second circuit U2 and the third circuit U3, the boundaries between the fourth circuit U4 and the fifth circuit U5, and the boundaries between the sixth circuit U6 and the seventh circuit U7, and the one end portion of the eighth circuit U8 opposite to the seventh circuit U7. That is to say, in the configuration as illustrated in FIG. 13A, in each of the circuits U1, U2, ..., U8, the distance (W1 to W9) between electrode pads 141a and 142a included in each electrode pad pair varies in direct contrast to that in Embodiment 1 (see FIG. 5B) along the length of the substrate 110 (along the Y axis in FIG. 13A).

Alternatively, the eight Zener diodes 160 may be located in one end portions (end portions on –Y sides in FIG. 13B) of the respective circuits U1 to U8 along the length of the substrate 110. In each of the circuits U1 to U8, a distance (W1 to W9) between electrode pads 141a and 142a included in each electrode pad pair may become shorter with decreasing distance to the one end portion of the circuit.

Alternatively, the eight Zener diodes 160 may be located close to the boundaries between the first circuit U1 and the second circuit U2, the boundaries between the third circuit U3 and the fourth circuit U4, the boundaries between the fifth circuit U5 and the sixth circuit U6, and the boundaries between the seventh circuit U7 and the eighth circuit U8. As illustrated in FIG. 14A, in each circuit, a distance (W1 to W9) between electrode pads 141a and 142a may be the same at positions located further from the Zener diode 160, and, at positions located close to the boundaries between the first circuit U1 and the second circuit U2, the boundaries between the third circuit U3 and the fourth circuit U4, the boundaries between the fifth circuit U5 and the sixth circuit U6, or the boundaries between the seventh circuit U7 and the eighth circuit U8 to some extent, the distance may become shorter with decreasing distance to a corresponding one of the boundaries.

Alternatively, locations of the eight Zener diodes 160 may be similar to those illustrated in FIG. 14A, and, as illustrated in FIG. 14B, in each circuit, a distance (W1 to W9) between electrode pads 141a and 142a included in each electrode pad pair may alternate between a first distance and a second distance that is more than the first distance, along the length of the substrate 110. In this case, in each circuit, the distance W1 between electrode pads 141a and 142a located in one end portion of the circuit along the length of the substrate 110 and the distance W9 between electrode pads 141a and 142a located in the other end of the circuit along the length of the substrate 110 each may be set to the first distance.

(2) In Embodiment 3, the lighting apparatus 1001 including a single light-emitting device 1 is described by way of example. The lighting apparatus, however, is not limited to the lighting apparatus 1001.

Figure 13B:
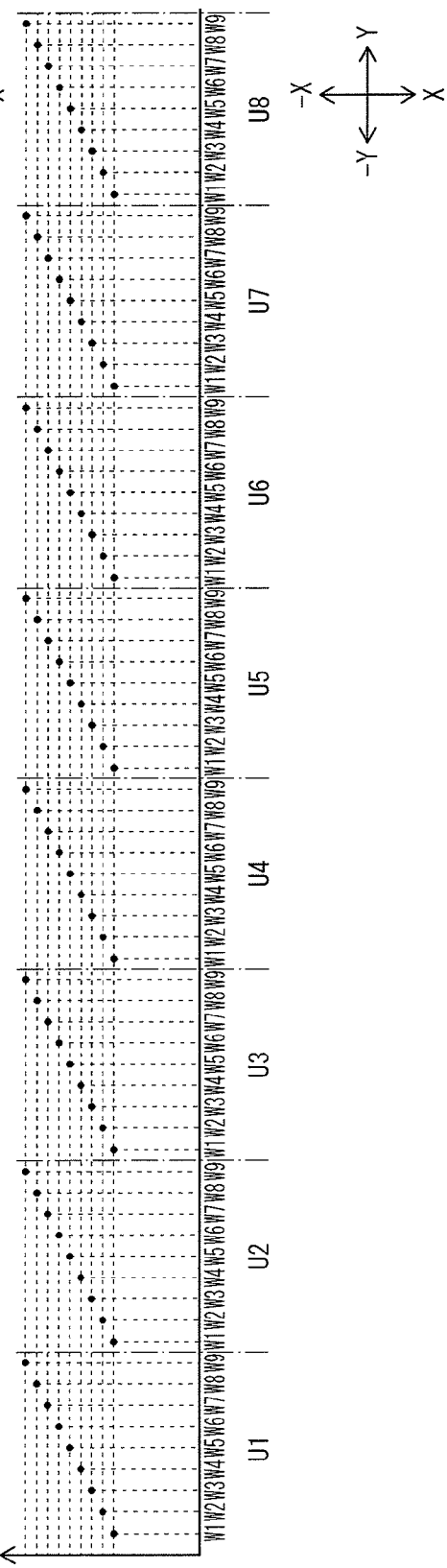
FIG. 13B shows relations between positions of circuits U1 to U8 and electrode pads, and distances between electrode pads in a light-emitting device pertaining to another Modification.
Figure 15:
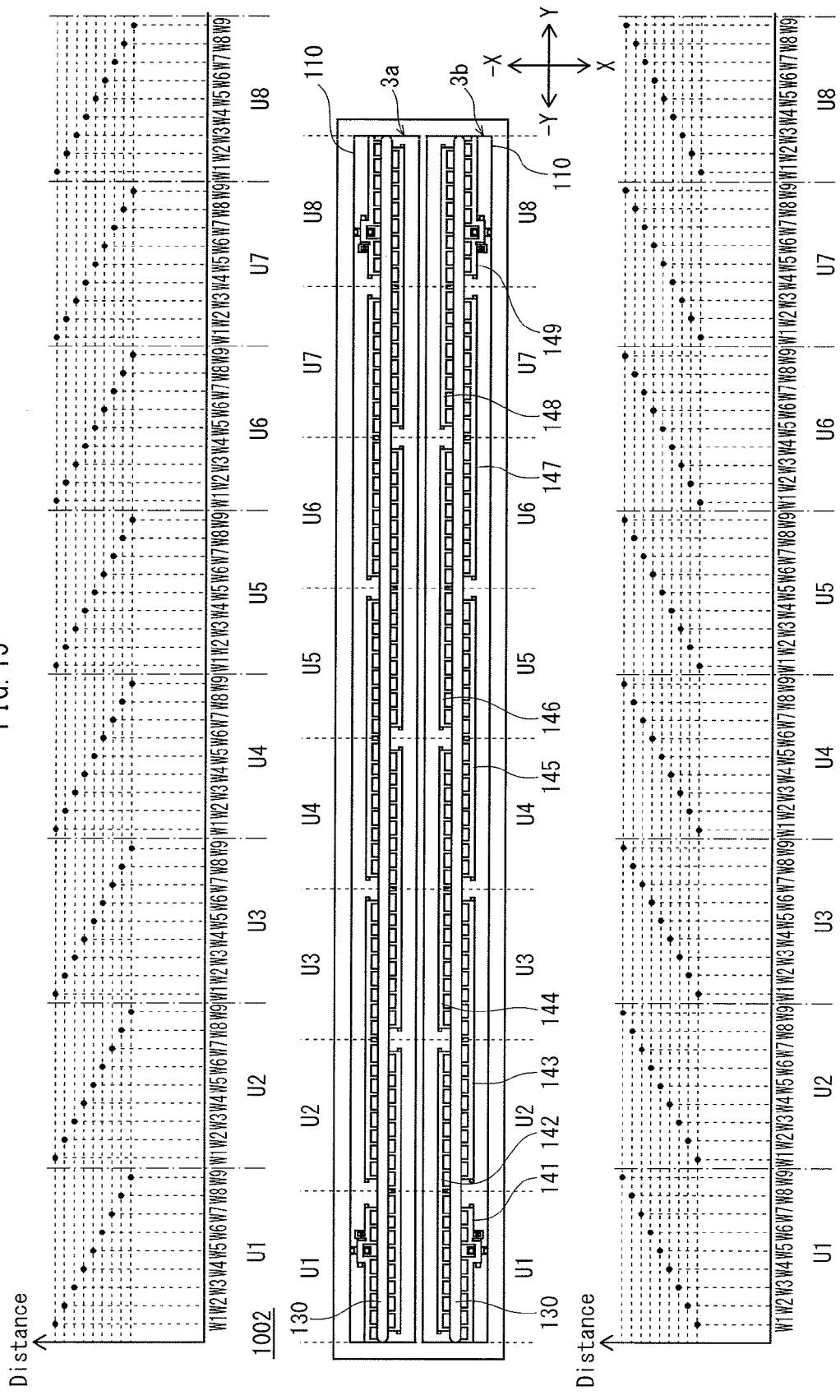
FIG. 15 illustrates a lighting apparatus pertaining to Modification.

For example, as illustrated in FIG. 15, the lighting apparatus may have configuration in which light-emitting devices described with use of FIG. 13B may be arranged in two rows.

In this case, as illustrated in FIG. 15, in a light-emitting device 3a, the eight Zener diodes 160 are located in one end portions on first sides (end portions on Y sides in FIG. 15) of the respective circuits U1 to U8 along the length of the substrate 110, and, in each circuit, a distance (W1 to W9) between electrode pads 141a and 142a included in each electrode pad pair becomes shorter with decreasing distance to the one end portion on the first side of the circuit. On the other hand, in a light-emitting device 3b, the eight Zener diodes 160 are located in the other end portions on second sides opposite the first sides (end portions on –Y sides in FIG. 15) of the respective circuits U1 to U8 along the length of the substrate 110, and, in each circuit, the distance (W1 to W9) between electrode pads 141a and 142a included in each electrode pad pair becomes shorter with decreasing distance to the other end portion on the second side of the circuit. That is to say, in the light-emitting device 3b, in each of the circuits U1 to U8, the distance (W1 to W9) between electrode pads 141a and 142a included in each electrode pad pair varies in direct contrast to that in light-emitting device 3a along the length of the substrate 110 (along the Y axis in FIG. 15). With this configuration, the light-emitting devices 3a and 3b cancel out unevenness in luminance occurring along the length of the substrate 110. As a result, unevenness in luminance of the lighting apparatus 1002 as a whole becomes less noticeable.

(3) Described by way of example in Embodiment 1 is the light-emitting device 1 including the eight circuits U1 to U8 each including the nine LEDs 120 and the single Zener diode connected in parallel. The light-emitting device, however, is not limited to the light-emitting device 1.

Figure 16:
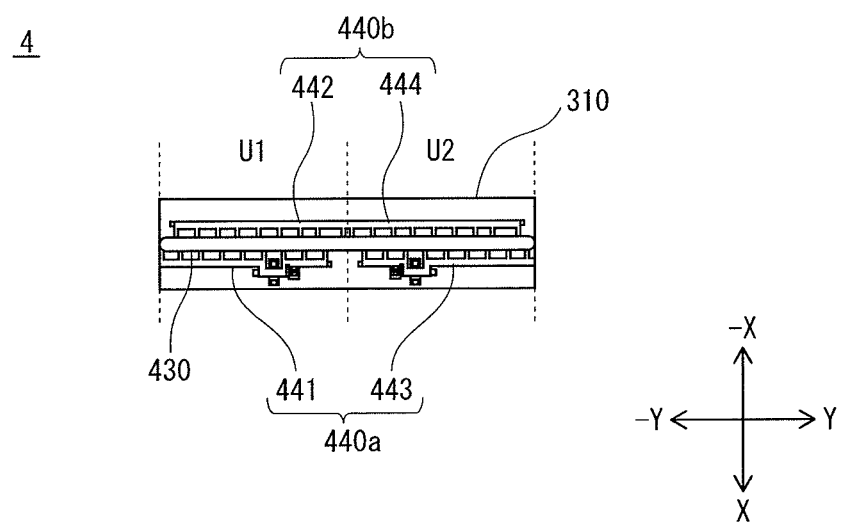
FIG. 16 is a plan view showing configuration of a light-emitting device pertaining to Modification.
Figure 19A:
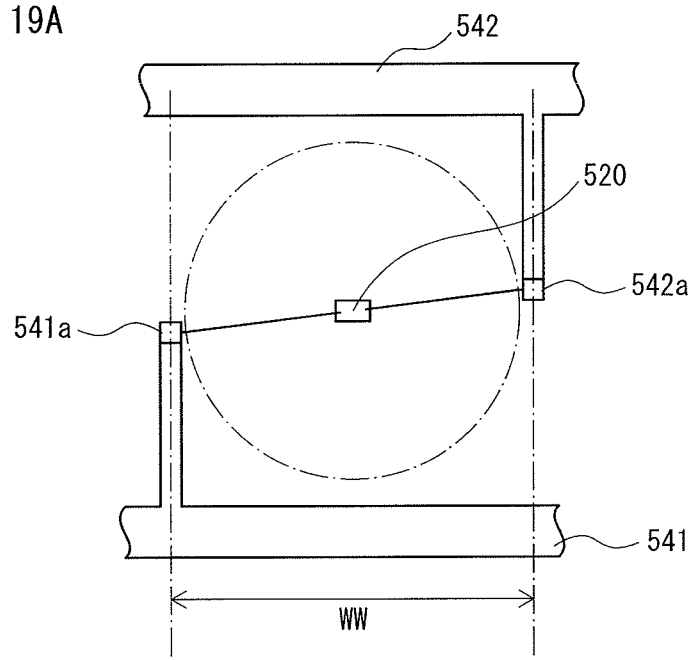
FIGS. 19A and 19B illustrate the technical problems.
Figure 19B:
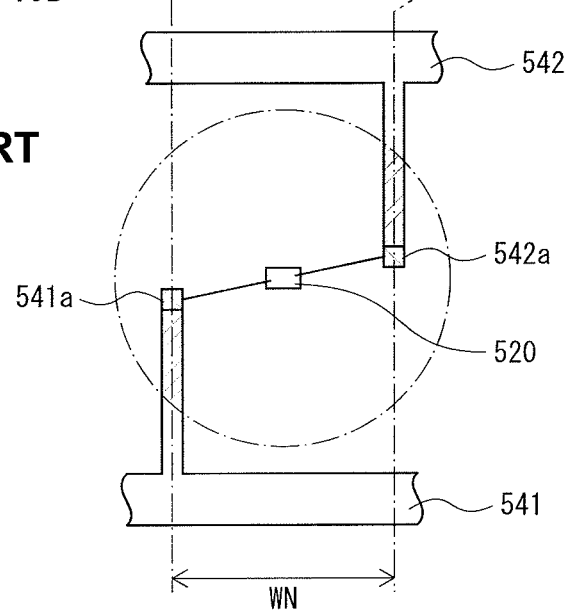

For example, as illustrated in FIG. 16, the light-emitting device may be a light-emitting device 4 that includes a substrate 310 being rectangular in plan view, first wiring 440a including first partial wiring 441 and second partial wiring 442, second wiring 440b including first partial wiring 443 and second partial wiring 444, and a sealing member 430. In this case, the first partial wirings 441 and 443 are arranged in parallel to the length of the substrate 310 (along the Y axis of FIG. 16), and have similar configuration to the first partial wiring 141 pertaining to Embodiment 1. Similarly, the first partial wirings 442 and 444 are arranged in parallel to the length of the substrate 310 (along the Y axis of FIG. 16), and have similar configuration to the second partial wiring 142 pertaining to Embodiment 1.

The number of circuits each including nine LEDs 120 and a single Zener diode connected in parallel is not limited to two or eight, and may be three or more and seven or less, or may be nine or more.

(4) Described by way of example in Embodiment 1 is the light-emitting device 1 including circuits each including the nine LEDs 120 and the single Zener diode 160 connected in parallel. The light-emitting device, however, is not limited to the light-emitting device 1, and may include circuits each including eight or less LEDs 120 and the single Zener diode 160 connected in parallel, or may include circuits each including ten or more LEDs 120 and the single Zener diode 160 connected in parallel.

(5) Described by way of example in Embodiment 3 is the lighting apparatus 1001 that includes a single light-emitting device 1. The lighting apparatus, however, is not limited to the lighting apparatus 1001.

For example, as illustrated in FIG. 17A, the lighting apparatus may be a lighting apparatus 1003 including four light-emitting devices 1 arranged in a row so that the lengthwise direction of each light-emitting device 1 coincides with the arrangement direction of the four light-emitting devices 1.

Alternatively, as illustrated in FIG. 17B, the lighting apparatus may be a lighting apparatus 1004 including two rows of two light-emitting devices 1 so that the lengthwise direction of each light-emitting device 1 coincides with the arrangement direction of the two light-emitting devices 1 in each row.

Furthermore, as illustrated in FIG. 17C, the lighting apparatus may be a lighting apparatus 1005 including eight light-emitting devices 1 arranged so that the lengthwise direction of each light-emitting device 1 is perpendicular to the arrangement direction of the eight light-emitting devices 1.

Alternatively, as illustrated in FIG. 17D, the lighting apparatus may be a lighting apparatus 1006 including (i) five light-emitting devices 1 arranged so that the lengthwise direction of each of the five light-emitting devices 1 is perpendicular to the arrangement direction of the five light-emitting devices 1 and (ii) two other light-emitting devices 1 arranged at opposite sides of the five light-emitting devices 1 in the lengthwise direction of each of the five light-emitting devices 1 so that the lengthwise direction of each of the two light-emitting devices 1 coincides with the arrangement direction of the five light-emitting devices 1.

Described by way of example in Modifications is a case where the light-emitting device 1 pertaining to Embodiment 1 is used. In place of the light-emitting device 1, however, the light-emitting device 2 pertaining to Embodiment 2 may be used.

(6) Described by way of example in Embodiment 1 is a case where the LEDs 120 are mounted on the substrate 110 with their faces up. The method of mounting the LEDs 120, however, is not limited to the above-mentioned method. For example, lands (not illustrated) for mounting thereon electrodes of the LEDs 120 may be formed, and the lands may be connected to the electrode pads 141a and 142a by wires 195.

REFERENCE SIGNS LIST 1, 2, 3a, 3b, 4 light-emitting device
110 substrate
111 plate member
112 insulating film
120 LED (light-emitting element)
130 sealing member
140a first wiring
140b second wiring
141, 143, 145, 147, 149, 151, 153, 155, 241, 243, 245, 247, 249, 251, 253, 255 first partial wiring
141a, 142a, . . . , 156a, 241a, 242a, . . . , 256a electrode pad
142, 144, 146, 148, 150, 152, 154, 156, 242, 244, 246, 248, 250, 252, 254, 256 second partial wiring
160 Zener diode
171, 172, . . . , 186 examination pad
1001, 1002, 1003, 1004, 1005, 1006 lighting apparatus
2001 liquid crystal display apparatus
1010 back light unit
U1, U2, . . . , U8 circuit (group)

The invention claimed is:

1. A light-emitting device, comprising:
a substrate;
light-emitting elements arranged on the substrate in a row;
electrode pad pairs formed on the substrate in one-to-one correspondence to the light-emitting elements, each electrode pad pair including two electrode pads located on the substrate at opposite sides of a corresponding light-emitting element in an arrangement direction of the light-emitting elements;
Zener diodes provided in one-to-one correspondence to groups each constituted by at least three consecutive sets of light-emitting elements and electrode pad pairs, each Zener diode being located between any two adjacent electrode pads included in different electrode pad pairs; and
a sealing member provided on the substrate to seal the light-emitting elements, the electrode pad pairs, and the Zener diodes, wherein
in each group,
a distance between two electrode pads included in an electrode pad pair corresponding to a light-emitting element located closest to the Zener diode is shorter than a distance between two electrode pads included in any other electrode pad pair,
a distance between two electrode pads included in each electrode pad pair varies between at least two electrode pad pairs other than the electrode pad pair corresponding to the light-emitting element located closest to the Zener diode, and
a distance between two electrode pads included in each electrode pad pair becomes shorter with decreasing distance to the Zener diode.

2. The light-emitting device of claim 1, wherein
in each group, a distance between (i) the light-emitting element located closest to the Zener diode and (ii) a light-emitting element located opposite the Zener diode with the light-emitting element located closest to the Zener diode therebetween is shorter than any other distance between light-emitting elements.

3. The light-emitting device of claim 1, wherein
a distance between neighboring light-emitting elements becomes shorter with decreasing distance to the Zener diode.

4. The light-emitting device of claim 1, wherein
the substrate is rectangular in plan view, and
the light-emitting elements are arranged along a length of the substrate.

5. The light-emitting device of claim 1, wherein
the Zener diode is provided in one end portion of each group in the arrangement direction of the light-emitting elements.

6. The light-emitting device of claim 1, wherein
the Zener diode is provided in a middle portion of each group in the arrangement direction of the light-emitting elements.

7. The light-emitting device of claim 1, wherein
when electrode pads included in each group are referred to as first electrode pads, each group further includes second electrode pads.

8. The light-emitting device of claim 1, wherein
each of the light-emitting elements is electrically connected to a corresponding electrode pad pair by wires,
the Zener diode is electrically connected to the two adjacent electrode pads by wires, and
each of the wires extends along the arrangement direction of the light-emitting elements.

9. The light-emitting device of claim 1, wherein
the sealing member is made of a light-transmissive material containing phosphors.

10. A lighting apparatus, including the light-emitting device of claim 1.

* * * * *